United States Patent
Hikosaka et al.

(10) Patent No.: US 10,420,209 B2
(45) Date of Patent: Sep. 17, 2019

(54) HIGHLY HEAT-RESISTANT POLYESTER SHEET

(71) Applicants: HIROSHIMA UNIVERSITY, Higashi-Hiroshima-shi, Hiroshima (JP); TEIJIN FILM SOLUTIONS LIMITED, Tokyo (JP)

(72) Inventors: Masamichi Hikosaka, Hiroshima (JP); Kiyoka Okada, Hiroshima (JP); Yoshitaka Tanaka, Tokyo (JP)

(73) Assignee: HIROSHIMA UNIVERSITY, Hiroshima (JP)

( * ) Notice: Subject to any disclaimer, the term of this patent is extended or adjusted under 35 U.S.C. 154(b) by 119 days.

(21) Appl. No.: 15/507,807

(22) PCT Filed: Aug. 24, 2015

(86) PCT No.: PCT/JP2015/073756
§ 371 (c)(1),
(2) Date: Mar. 1, 2017

(87) PCT Pub. No.: WO2016/035598
PCT Pub. Date: Mar. 10, 2016

(65) Prior Publication Data
US 2017/0295645 A1 Oct. 12, 2017

(30) Foreign Application Priority Data
Sep. 2, 2014 (JP) .................................. 2014-178490

(51) Int. Cl.
*H05K 1/03* (2006.01)
*B32B 27/36* (2006.01)
(Continued)

(52) U.S. Cl.
CPC ........... *H05K 1/0393* (2013.01); *B29C 48/08* (2019.02); *B29C 48/88* (2019.02); *B29C 48/914* (2019.02);
(Continued)

(58) Field of Classification Search
None
See application file for complete search history.

(56) References Cited

U.S. PATENT DOCUMENTS

| | | |
|---|---|---|
| 4,798,875 A | 1/1989 | Itoyama et al. |
| 9,605,116 B2 * | 3/2017 | Hikosaka ............. B29C 43/222 |

(Continued)

FOREIGN PATENT DOCUMENTS

| | | |
|---|---|---|
| CN | 102337008 A | 2/2012 |
| CN | 103153571 A | 6/2013 |

(Continued)

OTHER PUBLICATIONS

"Bibliographical data—CN 103890052 A" (published Jun. 25, 2014). (Year: 2014).*

(Continued)

*Primary Examiner* — Vivian Chen
(74) *Attorney, Agent, or Firm* — Sughrue Mion, PLLC

(57) ABSTRACT

The polyester sheet in accordance with an aspect of the present invention contains crystals of polyester which is a polycondensate of polyvalent carboxylic acid and polyalcohol. The polyester sheet contains nano-oriented crystals which contain crystals of polyester in each of which a polymer chain is highly oriented and each of which has a crystal size of 50 nm or less. A heatproof temperature of the polyester sheet is higher than a temperature that is lower than an equilibrium melting point of the polyester by 80° C., (Continued)

and a melting point of the polyester sheet is higher than a temperature that is lower than the equilibrium melting point of the polyester by 40° C.

13 Claims, 11 Drawing Sheets

(51) Int. Cl.
| | |
|---|---|
| *C08L 67/03* | (2006.01) |
| *B32B 27/06* | (2006.01) |
| *C08L 67/00* | (2006.01) |
| *C08L 67/02* | (2006.01) |
| *C08G 63/181* | (2006.01) |
| *C08G 63/187* | (2006.01) |
| *C08G 63/189* | (2006.01) |
| *C08G 63/16* | (2006.01) |
| *C08G 63/02* | (2006.01) |
| *C08G 63/12* | (2006.01) |
| *C08G 63/18* | (2006.01) |
| *C08G 63/185* | (2006.01) |
| *B29C 48/08* | (2019.01) |
| *B29C 48/88* | (2019.01) |
| *C08J 5/18* | (2006.01) |
| *B29D 7/00* | (2006.01) |
| *H05K 3/00* | (2006.01) |
| *C08G 63/183* | (2006.01) |
| *B29K 67/00* | (2006.01) |
| *B29L 31/34* | (2006.01) |

(52) U.S. Cl.
CPC .................. *B29D 7/00* (2013.01); *C08J 5/18* (2013.01); *H05K 3/0014* (2013.01); *B29K 2067/003* (2013.01); *B29K 2995/0016* (2013.01); *B29L 2031/3425* (2013.01); *B32B 27/06* (2013.01); *B32B 27/36* (2013.01); *B32B 2307/30* (2013.01); *B32B 2307/306* (2013.01); *B32B 2307/514* (2013.01); *B32B 2307/704* (2013.01); *B32B 2307/72* (2013.01); *B32B 2367/00* (2013.01); *B32B 2457/08* (2013.01); *C08G 63/02* (2013.01); *C08G 63/12* (2013.01); *C08G 63/16* (2013.01); *C08G 63/18* (2013.01); *C08G 63/181* (2013.01); *C08G 63/183* (2013.01); *C08G 63/185* (2013.01); *C08G 63/187* (2013.01); *C08G 63/189* (2013.01); *C08J 2367/02* (2013.01); *C08L 67/00* (2013.01); *C08L 67/02* (2013.01); *C08L 67/03* (2013.01); *H05K 1/03* (2013.01); *H05K 1/0326* (2013.01); *H05K 2201/0145* (2013.01); *Y10T 428/31681* (2015.04); *Y10T 428/31786* (2015.04)

(56) References Cited

U.S. PATENT DOCUMENTS

| | | | |
|---|---|---|---|
| 2005/0239997 A1* | 10/2005 | Matsumoto | C08G 63/80 528/272 |
| 2007/0026223 A1* | 2/2007 | Osada | B32B 27/08 428/332 |
| 2008/0182472 A1 | 7/2008 | Ogasawara et al. | |
| 2009/0249883 A1* | 10/2009 | Hikosaka | B29C 47/8815 73/760 |
| 2010/0063235 A1* | 3/2010 | Hikosaka | C08F 10/06 526/351 |
| 2011/0300364 A1 | 12/2011 | Hikosaka et al. | |
| 2013/0071592 A1 | 3/2013 | Liu et al. | |
| 2013/0196168 A1 | 8/2013 | Hikosaka et al. | |

FOREIGN PATENT DOCUMENTS

| | | |
|---|---|---|
| CN | 103890052 A | 6/2014 |
| EP | 0 314 785 A1 | 5/1989 |
| EP | 1 938 948 A1 | 7/2008 |
| EP | 2 128 177 A1 | 12/2009 |
| EP | 2 390 079 A1 | 11/2011 |
| JP | 7-329170 A | 12/1995 |
| JP | 3804023 B1 | 8/2006 |
| JP | 2011-157442 A | 8/2011 |
| JP | 2013-240940 A | 12/2013 |
| WO | 2010/084750 A1 | 7/2010 |

OTHER PUBLICATIONS

"Bibliographical data—CN 103153571 A" (published Jun. 12, 2013). (Year: 2013).*
Communication dated Jul. 20, 2017 from the European Patent Office in counterpart application No. 15837584.0.
Communication dated May 25, 2018 from the State Intellectual Property Office of the P.R.C. in counterpart Application No. 201580046901.7.
International Preliminary Report on Patentability and Written Opinion for PCT/JP2015/073756, international dated Mar. 16, 2017, 6 pages.
International Search Report for International Application No. PCT/JP2015/073756 dated Oct. 20, 2015, 2 pages.
Toshio Kunugi et al., Preparation of High-Modulus and High-Strength Poly(ethylene Terephthalate) Film by Zone-Annealing Method; Journal of Applied Science, vol. 31, pp. 429-439 (1986).
T. Uchiyama et al., Layer structure formation in oriented poly(ethylene terephthalate) relating to micromechanical properties; Polymer 48 (2007), pp. 542-555.
M. Evstatiev et al., Structure and Mechanical Properties of Highly Oriented Poly(Ethylene Terephthalate) Films, Polymer Engineering and Science, Jul. 1992, vol. 32, No. 14, pp. 964-970.
Chinese Office Action dated Jul. 26, 2019 by the National Intellectual Property Administration, P.R. China, for CN Application No. 2015800146901.7; 22 pages including English translation.

* cited by examiner

HIGHLY HEAT-RESISTANT POLYESTER SHEET

CROSS REFERENCE TO RELATED APPLICATIONS

This application is a National Stage of International Application No. PCT/JP2015/073756, filed on Aug. 24, 2015 (which claims priority from Japanese Patent Application No. 2014-178490, filed on Sep. 2, 2014), the contents of which are incorporated herein by reference in their entirety.

TECHNICAL FIELD

The present invention relates to a highly heat-resistant polyester sheet (or highly heat-resistant polyester film) which is made of a polycondensate of polyvalent carboxylic acid (dicarboxylic acid) and polyalcohol (diol). More specifically, the highly heat-resistant polyester sheet (or highly heat-resistant polyester film) in accordance with the present invention is a polymeric material in a form of sheet (or film) which contains nano-oriented crystals of polyester.

BACKGROUND ART

Petroleum-derived polyester (hereinafter referred to as "polyester") such as polyethylene terephthalate (PET), polybutylene terephthalate (PBT), and polyethylene naphthalate (PEN) is known as high-performance/high-functional plastic which is excellent in dynamic characteristic, heat resistance, transparency, and the like, as compared with polyolefin which is commodity plastic. In particular, PET is inexpensive and is therefore used in large amounts (annual production in Japan: approximately 700,000 tons) in various kinds of bottles, containers, industrial products, industrial parts, and the like, and is also famous as a recyclable substance. Moreover, PBT, PEN, and the like are classified into engineering plastic which is a high-performance resin. Here, the engineering plastic is defined as a resin whose heatproof temperature is 100° C. or higher, tensile strength is 50 MPa or more, and tensile modulus of elasticity is 2.5 GPa or more. Further, engineering plastic whose heatproof temperature is 150° C. or higher is called "super engineering plastic" and there is a growing demand for such super engineering plastic in the field in which higher heat resistance of electronic apparatuses and the like is requested.

In order to improve mechanical characteristics (such as tensile strength and tensile modulus of elasticity) and heat resistance of polyester such as PET, a polyester sheet and a polyester film (stretched sheet and stretched film) are used which are obtained by subjecting polyester to stretching treatment. However, in conventional polyester stretched sheet products and polyester stretched film products, the high performance intrinsic to polyester is not sufficiently achieved. This is because the conventional polyester stretched sheet and polyester stretched film have a laminated lamellar structure in which folded chain crystals (FCC) and amorphous materials are laminated, and contain the amorphous material which is low in performance at a ratio of 50% or higher. For example, although a conventional uniaxially-stretched PET sheet has a tensile strength ($\sigma$) of 230 MPa and a tensile modulus of elasticity ($E_t$) of 2.3 GPa at a room temperature, a heatproof temperature ($T_h$) of the conventional uniaxially-stretched PET sheet is approximately 120° C., which is notably lower than a melting point ($T_m$) of 250° C. to 265° C. and an equilibrium melting point ($T_m^0$) of 310° C. of PET. Therefore, the conventional uniaxially-stretched PET sheet has been difficult to use in the field in which high heat resistance is requested. This fact has prevented PET from being fully employed in industrial products.

Here, Patent Literatures 1 and 2 and Non-Patent Literatures 1 through 3 disclose techniques in relation to a uniaxially-stretched sheet of polyester such as PET. However, the uniaxially-stretched polyester sheets disclosed in those literatures all have the above described laminated lamellar structure. FIGS. 4 and 6 of Non-Patent Literature 1 illustrate a typical 4-point image which indicates that the uniaxially-stretched PET has a laminated lamellar structure based on a small-angle X-ray scattering pattern (SAXS pattern) of the uniaxially-stretched PET. Moreover, FIG. 8 of Non-Patent Literature 1 schematically illustrates a uniaxially-stretched PET sheet which has a laminated lamellar structure in which amorphous materials and crystals are laminated. Moreover, FIG. 5 of Non-Patent Literature 3 also illustrates a small-angle X-ray scattering pattern (SAXS pattern) of uniaxially-stretched PET by a typical 4-point image of a laminated lamellar structure.

CITATION LIST

Patent Literature

[Patent Literature 1]
Japanese Patent Application Publication Tokukaihei No. 7-329170 (Publication date: Dec. 19, 1995)
[Patent Literature 2]
Japanese Patent No. 3804023 (Publication date: Aug. 2, 2006)

Non-patent Literature

[Non-patent Literature 1]
T. Uchiyama et. al., Polymer 48 (2007), 542-555
[Non-patent Literature 2]
TOSHIO KUNIGI et. al., Journal of Applied Polymer Science, Vol. 31, 429-439 (1986)
[Non-patent Literature 3]
M. EVSTATIEV et. al., POLYMER ENGINEERING AND SCIENCE, JULY 1992, Vol. 32, No. 14

SUMMARY OF INVENTION

Technical Problem

As above described, polyester sheets and polyester films of PET and the like are relatively inexpensive and excellent in mechanical characteristics, but are insufficient in heat resistance. Therefore, it has been difficult to fully employ such polyester sheets and polyester films of PET and the like in industrial products.

In view of this, an object of the present invention is to provide a highly heat-resistant polyester sheet (highly heat-resistant polyester film) in which polyester such as PET is given high heat resistance.

Solution to Problem

In order to attain the object, the inventors of the present invention have diligently studied and, as a result, succeeded for the first time in obtaining a polyester sheet which contains nano-oriented crystals (NOC) of polyester by crystallizing a melt of polyester while elongating the melt at a rate not lower than a critical elongation strain rate. The present invention has been accomplished based on finding that a PET sheet which is an example of the polyester sheet has a higher heatproof temperature ($T_h \approx 278°$ C.) and a higher melting point ($T_m \approx 281°$ C.), as compared with a conventional uniaxially-stretched sheet (in another example also, PET has a higher heatproof temperature ($T_h \approx 281°$ C.) and a higher melting point ($T_m \approx 285°$ C.)). In still another example, a polyester sheet containing NOC of PEN has a higher heatproof temperature ($T_h \approx 291°$ C.) and a higher melting point ($T_m \approx 306°$ C.).

That is, a polyester sheet in accordance with an aspect of the present invention is a polyester sheet containing crystals of polyester which is a polycondensate of polyvalent carboxylic acid and polyalcohol, the crystals being nano-oriented crystals containing crystals of polyester in each of which a polymer molecular chain is oriented and each of which has a crystal size of 50 nm or less, and a heatproof temperature of the polyester sheet being higher than a temperature that is lower than an equilibrium melting point of the polyester by 80° C.

A melting point of the polyester sheet in accordance with an aspect of the present invention is preferably higher than a temperature that is lower than the equilibrium melting point of the polyester by 40° C.

In the polyester sheet in accordance with an aspect of the present invention, the nano-oriented crystals can have a structure in which spindle-shaped crystals are arranged in such a manner as to be tied in a row.

The heatproof temperature of the polyester sheet in accordance with an aspect of the present invention can be 200° C. or higher.

The polyester of the polyester sheet in accordance with an aspect of the present invention can be polyethylene terephthalate or polyethylene naphthalene dicarboxylate.

The polyester of the polyester sheet in accordance with an aspect of the present invention can be polyethylene terephthalate.

A density of the polyester sheet in accordance with an aspect of the present invention can be 1.4 g/cm$^3$ or more.

In the polyester sheet in accordance with an aspect of the present invention, an orientation function of the nano-oriented crystals can be 0.9 or more.

In the polyester sheet in accordance with an aspect of the present invention, MFR of the polyester at 280° C. is 80 g/10 min or less.

In the polyester sheet in accordance with an aspect of the present invention, a crystal form of the nano-oriented crystals in the polyester can be monoclinic.

The polyester sheet in accordance with an aspect of the present invention can be a polyester sheet which is used in high-temperature processing.

The polyester sheet in accordance with an aspect of the present invention can be a polyester sheet used as a base material of a laminated body including an electrically conductive transparent layer.

The polyester sheet in accordance with an aspect of the present invention can be a polyester sheet used as a base material of a flexible circuit board.

The present invention can be directed to a flexible circuit board including a polyester sheet in accordance with an aspect of the present invention as a base material.

Advantageous Effects of Invention

The polyester sheet in accordance with an aspect of the present invention has a higher heat resistance and a higher melting point as compared with a conventional polyester sheet. Therefore, according to the present invention, it is possible to use, in industrial products requested to have heat resistance, the polyester sheet which is made of PET or the like and has been difficult to use as engineering plastic or super engineering plastic due to insufficient heat resistance.

BRIEF DESCRIPTION OF DRAWINGS

Each of (a), (b), (c), and (d) of FIG. 1 is a polarization microscope image (i.e., result observed from through direction) of a sample in accordance with Example, and each of (e) and (f) of FIG. 1 is a polarization microscope image (i.e., result observed from through direction) of a sample in accordance with Comparative Example.

DESCRIPTION OF EMBODIMENTS

Figure 1:
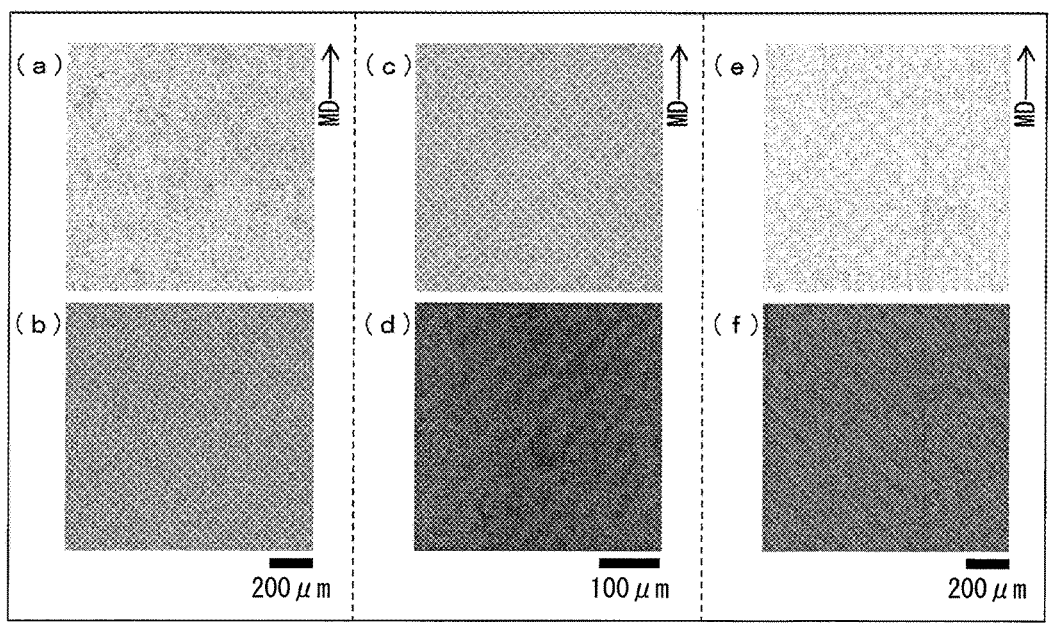

The following description will discuss details of the present invention. The scope of the present invention is, however, not limited to this description. Besides the examples below, the present invention can also be modified and put into practice within the range of not impairing the purpose of the present invention. Moreover, all the literatures described in this specification are hereby incorporated by reference.

In this specification, any range expressed by "to" means "not less (lower) than, and not more (higher) than", unless otherwise noted. For example, an expression "A to B" means "not less (lower) than A and not more (higher) than B".

(1) Polyester Sheet of Present Invention

The present invention relates to a polyester sheet containing crystals of polyester having a high heatproof temperature and a high melting point. The "polyester sheet" means not only a sheet-shaped polyester having an average thickness of 0.15 mm or more but also a film-shaped polyester having an average thickness of smaller than 0.15 mm. Note that the average thickness is not particularly limited, and can be adjusted as appropriate by adjusting an extrusion rate or the like in accordance with a purpose of use. A specific thickness can be preferably 1 μm to 10 mm, 2 μm to 5 mm, and particularly 3 μm to 1 mm. Here, the "thickness" means a distance from one surface to the other surface of a polymer sheet measured under a constant static load. The "average thickness" means an average value of a largest thickness and a smallest thickness of the polymer sheet. Note that the thickness of the polymer sheet can be measured by using a micrometer or using a scale calibrated with an optical stereoscopic microscope (SZX10-3141 manufactured by Olympus Corporation) and an objective micrometer.

The "polyester" means a polycondensate of polyvalent carboxylic acid (dicarboxylic acid) and polyalcohol (diol). That is, the polyester of the present invention excludes polyester (e.g., polylactic acid PLA, polyhydroxybutyrate PHB) which is not the polycondensate of polyvalent carboxylic acid (dicarboxylic acid) and polyalcohol (diol). The polyester of the present invention can be prepared by, for example, causing polyalcohol (i.e., a compound containing plural sets of alcoholic functional group-OH) to react (by dehydration condensation) with polyvalent carboxylic acid (i.e., a compound containing plural sets of carboxylic acid functional group-COOH). Note that the polyester of the present invention can be a homopolymer or can be a copolymer.

Specific examples of the polyvalent carboxylic acid (dicarboxylic acid) encompass adipic acid, sebacic acid, azelaic acid, terephthalic acid, isophthalic acid, naphthalenedicarboxylic acid (2,6-naphthalenedicarboxylic acid, 2,7-naphthalenedicarboxylic acid, 1,4-naphthalenedicarboxylic acid), 4,4-diphenyldicarboxylic acid, 4,4'-(alkylenedioxy)bisbenzoic acid such as 4,4'-(ethylenedioxy)bisbenzoic acid, 6,6'-(alkylenedioxy)di-2-naphthoic acid such as 6,6'-(ethylenedioxy)di-2-naphthoic acid, 9,9-bis[4-(2-carboxyalkoxy)phenyl]fluorene, 1,4-cyclohexanedicarboxylic acid, 1,4-cyclohexanedimethylcarboxylic acid, and the like. Among those, terephthalic acid and 2,6-naphthalenedicarboxylic acid are preferable.

Examples of the polyalcohol (diol) encompass ethylene glycol, trimethylene glycol, 1,4-butylene glycol, hexanediol, cyclohexanedimethanol, an alkylene oxide addition product of bisphenol such as 9,9-bis[4-(2-hydroxyethoxy)phenyl]fluorene, spiroglycol, and the like. Among those, ethylene glycol and cyclohexanedimethanol are preferable.

The polyester of the present invention is not limited, and examples of the polyester encompass polyethylene terephthalate (PET), polytrimethylene terephthalate (PTT), polybutylene terephthalate (PBT), polyethylene naphthalene dicarboxylate (PEN), polytrimethylene naphthalene dicarboxylate (PTN), polybutylene naphthalene dicarboxylate (PBN), polycyclohexanedimethylene terephthalate (PCT), polycyclohexanedimethylene naphthalene dicarboxylate (PCN), polycyclohexanedimethylene cyclohexane dimethylcarboxylate (PCC), and the like. Among those, PET, PEN, PCT, and PCN are preferable, and PET and PEN are particularly preferable.

The polyester sheet of the present invention has a high heatproof temperature. Here, the "heatproof temperature" means a heatproof temperature measured by a test-piece size direct-reading method with use of an optical microscope. The "test-piece size direct-reading method" is carried out with use of an optical microscope with a CCD camera (BX51N-33P-OC manufactured by Olympus Corporation), a hot stage (L-600A manufactured by Linkam Scientific Instruments Ltd.), and image-analysis software (Image-Pro PLUS manufactured by Media Cybernetics, Ltd.) that can quantitatively determine a size displayed on a screen. The test piece has a length of 0.7 mm and a width of 0.5 mm. The test piece is heated at a temperature increase rate of 1 K per minute, and a temperature at which the test piece starts to be strained (shrink or expand) by 3% or more in a length direction (MD) or a width direction (TD) is considered as the heatproof temperature.

The heatproof temperature of the polyester sheet in accordance with an aspect of the present invention is higher than a temperature that is lower than an equilibrium melting point of the polyester by 80° C. (more preferably lower than the equilibrium melting point by 60° C., further preferably lower than the equilibrium melting point by 40° C.). For example, an equilibrium melting point of PET is known to be 310° C. (Reference Document: Polymer, 1977, Vol 18, 1121-1129) and therefore, in a case where the polyester sheet in accordance with an aspect of the present invention is PET, the heatproof temperature is higher than 230° C. (=310° C.−80° C.). The heatproof temperature of the polyester sheet in accordance with an aspect of the present invention is preferably 200° C. or higher (more preferably 230° C. or higher, further preferably 250° C. or higher, most preferably 280° C. or higher), although it depends on a resin constituting the polyester. When compared in regard to PET, a heatproof temperature of a conventionally known uniaxially-stretched sheet of PET is approximately 120° C., and it is thus evident that the heat resistance of the polyester sheet in accordance with an aspect of the present invention is notably high.

Moreover, the polyester sheet in accordance with an aspect of the present invention is high in melting point, as well as the high heat resistance. That is, the melting point of the polyester sheet in accordance with an aspect of the present invention is preferably higher than a temperature which is lower than the equilibrium melting point of the polyester by 40° C. (more preferably lower than the equilibrium melting point by 35° C., further preferably lower than the equilibrium melting point by 30° C.). For example, the equilibrium melting point of PET is known to be 310° C. (Reference Document: Polymer, 1977, Vol 18, 1121-1129) and therefore, in a case where the polyester sheet in accordance with an aspect of the present invention is PET, the melting point is higher than 270° C. (=310° C.−40° C.). In a case where the polyester sheet in accordance with an aspect of the present invention is, for example, PET or PEN, the melting point of the polyester sheet is preferably 270° C. or higher (more preferably 280° C. or higher, further preferably 290° C. or higher). When compared with a melting point of PET itself which is 250° C. to 265° C., the melting point of the polyester sheet in accordance with an aspect of the present invention is notably high. A melting point of a sample (PET sheet) in accordance with Example described later is 281° C., and such a fact that the melting point is notably increased as compared with the melting point of PET is a notable effect which could not have been expected by a person skilled in the art.

Here, the equilibrium melting point ($T_m^0$) is a melting point of a macroscopic-sized perfect crystal crystallized in a state in which a molecular chain of a polymer (hereinafter, also referred to as "polymer chain" as appropriate) is fully stretched, and is calculated by the following formula: $T_m^0 = \Delta H_u \div \Delta S_u$, $\Delta H_u$: enthalpy of fusion, $\Delta S_u$: entropy of fusion Meanwhile, the melting point is a temperature $T_m$ at which a crystal changes into a melt.

Note that the equilibrium melting point of the polyester is publicly known by documents. For example, an equilibrium melting point of PET is 310° C. (Reference Document: Polymer, 1977, Vol 18, 1121-1129), an equilibrium melting point of PEN is 312° C. (Reference Document: Intern. J. Polymeric Mater., 2001, Vol. 50, pp. 335-344), an equilibrium melting point of PBN is 276° C. (Reference Document: Polymer, 42, 2001, 5307-5045), and an equilibrium melting point of PBT is 245° C. (Reference Document: Makromol. Chem. 189, 2443-2458, 1988).

Here, the polyester sheet in accordance with an aspect of the present invention contains nano-oriented crystals (NOC) of the polyester. Here, NOC contain crystals of the polyester (also referred to nano crystals (NC)) each of which has a crystal size of 50 nm or less and in each of which a polymer chain is oriented in an elongation direction (machine direction, MD).

The polyester sheet in accordance with an aspect of the present invention is demanded to have high heat resistance, and therefore preferably contains NOC as a main component. For example, the polyester sheet in accordance with an aspect of the present invention preferably contains NOC of the polyester by 60% or higher (preferably 70% or higher, more preferably 80% or higher, more preferably 90% or higher, further preferably 95% or higher). A ratio (NOC fraction) of NOC contained in the polyester sheet can be calculated by an X-ray diffraction method. NOC are highly oriented, and non-NOC are isotropic. Therefore, the NOC fraction can be calculated based on an X-ray scattering intensity ratio.

Whether or not the polymer chain of NC contained in the NOC constituting the polyester sheet is oriented and whether or not NC themselves constituting the NOC are oriented can be confirmed by observation with use of a polarization microscope or by publicly known X-ray diffraction (small-angle X-ray scattering method, wide-angle X-ray scattering method). For specific methods of the observation with a polarization microscope and the X-ray diffraction (small-angle X-ray scattering method, wide-angle X-ray scattering method), refer to Example described later as appropriate.

In the NC constituting the NOC, the polymer chain contained in the NC is highly oriented. Therefore, an orientation function $f_c$ of the NOC is 0.9 or more (more preferably 0.95 or more, further preferably 0.97 or more). The orientation function $f_c$ can be measured by, for example, a publicly known wide-angle X-ray scattering method (hereinafter referred to as "WAXS method"). In a case where, for example, an imaging plate is used as a detector, the orientation function $f_c$ can be measured by the WAXS method with use of X-ray scattering intensity analysis software (R-axis display manufactured by Rigaku Corporation). For a method of calculating the orientation function $f_c$, refer to the descriptions in Example described later. It is known that, in a case of a crystalline polymer, mechanical strength in the elongation direction (MD) increases as the orientation function $f_c$ becomes larger. From this, the polyester sheet in accordance with an aspect of the present invention can accordingly be understood to have high mechanical strength.

The crystal size of NOC contained in the polyester sheet in accordance with an aspect of the present invention is 50 nm or less (preferably 40 nm or less, more preferably 30 nm or less, further preferably 25 nm or less). Here, the crystal size of the NOC can be obtained by a publicly known small-angle X-ray scattering method (hereinafter referred to as "SAXS method"). Note that a lower limit of the crystal size of the NOC is not limited, and is preferably 3 nm or more (preferably 5 nm or more, more preferably 8 nm or more, further preferably 10 nm or more), from the viewpoint of the melting point. In the SAXS method, in a case where the NOC fraction is large, a primary peak of a curve of the small-axis X-ray scattering intensity ($I_s$) against the scattering vector (q) corresponds to a shortest distance between microcrystals (=crystal size d) in cases where microcrystals of an average size d are randomly packed (Reference Document: A. Guinier, "*Ekkusu-sen Kessyogaku no Riron to Jissai*" (Theory and Practice of X-ray Crystallography), Rigaku Corporation, p. 513, 1967), and therefore the crystal size d is calculated by the following Bragg equation:

$$d = 2\pi \div q \qquad \text{Bragg equation}$$

Figure 6:
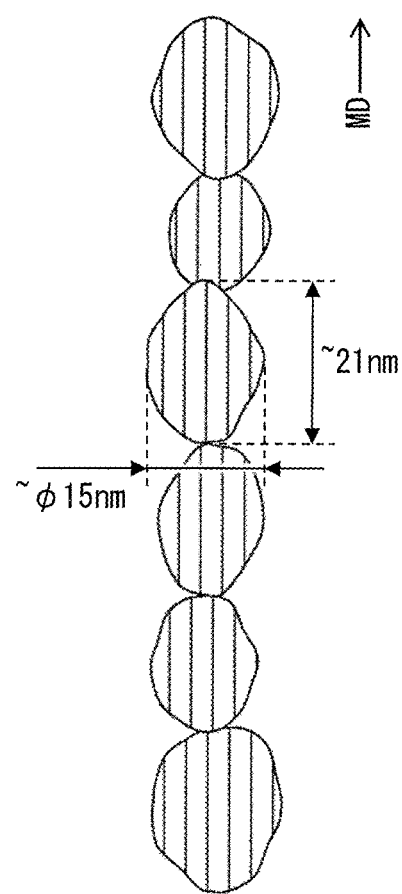
FIG. 6 is a schematic view illustrating a structure of NOC constituting a sample in accordance with Example.

A structure of the NOC constituting the polyester sheet in accordance with an aspect of the present invention is estimated with use of a polarization microscope and based on a result of X-ray diffraction. FIG. 6 illustrates a structure model of NOC of PET obtained in Example. The NOC constituting the polyester sheet obtained in Example are found to have a structure in which spindle-shaped crystals (NC) are arranged in such a manner as to be tied in a row in the elongation direction (MD). The spindle shape means a shape like a spindle, i.e., a columnar shape whose middle part is the thickest and which gradually becomes thinner toward both ends. Moreover, the spindle shape is similar to that of a rugby ball, and therefore the "spindle-shaped" can also be expressed as "rugby-ball-shaped".

The NC contained in the NOC and the polymer chain contained in the NC are found to be highly oriented substantially in the MD, and also arranged with a weak correlation in a width direction (tangential direction: TD) of the sheet and in a thickness direction (normal direction: ND) of the sheet. This is a characteristic structure of the polyester sheet in accordance with an aspect of the present invention. Note that the crystal size of the NC constituting the NOC contained in the polyester sheet in accordance with Example described later is found to be approximately 21 nm in the elongation direction (MD), approximately 15 nm in the width direction (TD) of the sheet, and approximately 15 nm in the thickness direction (ND) of the sheet, as illustrated in FIG. 6. A crystal size of a spindle-shaped crystal such as of the NC constituting the NOC can be a largest one of sizes measured in the MD, the TD, and the ND. That is, the crystal size of the NOC illustrated in FIG. 6 is approximately 21 nm.

A density of a uniaxially-stretched sheet of conventionally known polyester (PET) is normally less than 1.4 g/cm$^3$. On the other hand, a density of the polyester sheet in accordance with an aspect of the present invention is 1.4 g/cm$^3$ or more even in a case where the polyester sheet is made of PET, and is thus extremely high. As early described, the uniaxially-stretched sheet has the "laminated lamellar structure" in which folded chain crystals (FCC) and amorphous materials are laminated, and the presence of the amorphous materials seems to cause the decrease in density.

The NOC contained in the polyester sheet in accordance with an aspect of the present invention preferably have a triclinic (or triclinic system) crystal structure (unit cell structure). The fact that the NOC contained in the polyester sheet in accordance with an aspect of the present invention have such a crystal structure seems to lead to the high heat resistance of the polyester sheet in accordance with the present invention.

The NOC contained in the polyester sheet in accordance with an aspect of the present invention preferably have a monoclinic crystal form (morphology). The fact that the NOC contained in the polyester sheet in accordance with an aspect of the present invention have such a crystal form seems to lead to the high heat resistance of the polyester sheet in accordance with the present invention.

The polyester sheet in accordance with an aspect of the present invention has the excellent heat resistance, and therefore can be suitably used as, for example, a polyester sheet for high-temperature processing at a temperature higher than 200° C.

Specifically, in a case of being used for high-temperature processing, the polyester sheet in accordance with an aspect of the present invention can be suitably used as a base material on which an electrically conductive transparent layer made of ITO or the like is to be provided. That is, it is necessary to carry out a heating treatment at a high temperature in order to decrease electric resistance of the electrically conductive transparent layer, and it is possible to carry out treatment at a higher temperature, as compared with a conventional polyester sheet.

Alternatively, the polyester sheet in accordance with an aspect of the present invention can be used for a purpose of being used in a plating process, a soldering process, or the like. For example, the polyester sheet in accordance with an aspect of the present invention can be suitably used as a base material of a flexible circuit board on which a solder reflow process is carried out. Conventionally, the flexible circuit board is made of polyimide. The use of polyester has also been studied but dimensional stability obtained has been merely at a level of being used as a reinforcing plate (see Japanese Patent Application Publication Tokukai No. 2012-15441, Japanese Patent Application Publication Tokukai No. 2010-165986, and the like).

However, in the highly heat-resistant polyester sheet in accordance with an aspect of the present invention, the polyester can have a high heat resistance equivalent to that of polyimide. Therefore, the polyester sheet in accordance with an aspect of the present invention can be used not only as a reinforcing plate which does not directly contact with solder but also as a substrate itself which directly makes contact with solder.

(2) Method for Producing Polyester Sheet in Accordance with an Aspect of the Present Invention A method for producing the polyester sheet in accordance with an aspect of the present invention is not limited to a particular one and the polyester sheet in accordance with an aspect of the present invention can be produced by, for example, the following method. Note that, in the production method below, polyester in a melt state is subjected to rolling elongation and then crystallized (solidified). This method is completely different from a method in which a polyester sheet which has been once solidified is subjected to rolling elongation and thus a stretched sheet is produced.

Figure 10:
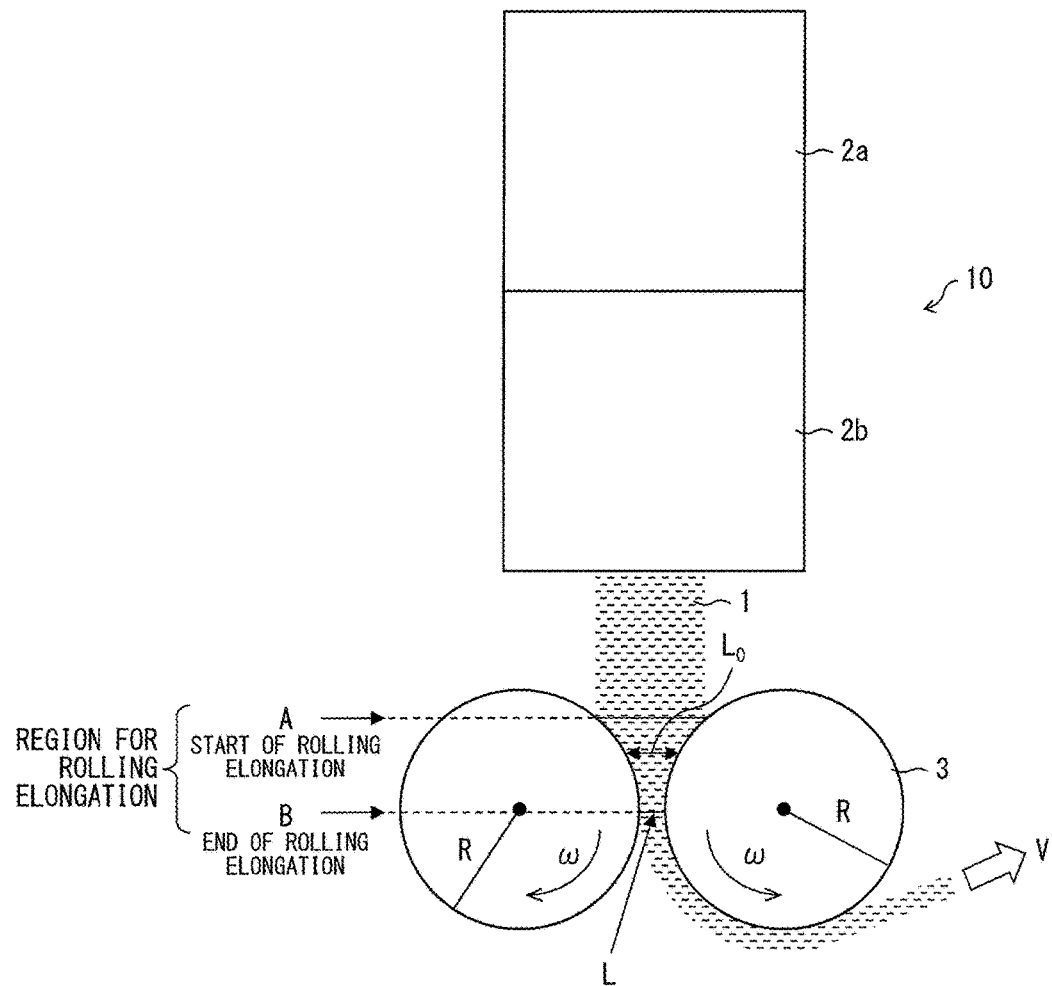
FIG. 10 is a schematic view of a rolling elongation crystallization device used to prepare a sample in accordance with Example.

FIG. 10 is a schematic view illustrating a device (rolling elongation crystallization device 10) for producing the polyester sheet in accordance with an aspect of the present invention. The rolling elongation crystallization device 10 includes a supercooled melt feeder (including an extruder 2a for melting the polyester and feeding a melt of the polyester; and a cooling adapter 2b for cooling the melt fed from the extruder 2a to a supercooled state) and sandwiching rollers 3. In the supercooled melt feeder, a slit die (not illustrated) is provided at an outlet of the extruder 2a, and a shape of an end of the slit die is a quadrangular shape. The polyester melt discharged from the slit die is cooled to a supercooled state while passing through the cooling adapter 2b (the melt in the supercooled state is referred to as "supercooled melt"), and the supercooled melt is discharged toward the sandwiching rollers 3. In a case where a difference between an equilibrium melting point and a crystallization temperature is defined as "supercooling degree $\Delta T$", a particularly optimal supercooling degree is not limited to a particular one because the supercooling degree notably varies depending on a type of polymer and characterization. For example, the supercooling degree $\Delta T$ is preferably 25° C. to 100° C. (more preferably 40° C. to 90° C., further preferably 60° C. to 85° C.).

The sandwiching rollers 3 are provided in such a manner that a pair of rotatable rollers face each other. The sandwiching rollers 3 sandwich the supercooled melt 1 fed from the supercooled melt feeder and elongate the supercooled melt 1 in a rotating direction of the rollers so as to form the supercooled melt 1 into a sheet shape.

In a case where the polyester sheet in accordance with an aspect of the present invention is produced, the supercooled melt 1 is fed from the supercooled melt feeder, and is sandwiched between the sandwiching rollers 3, is elongated by rolling at an elongation strain rate not less than a critical elongation strain rate, and is crystallized in this state. This allows the supercooled melt 1 to become an oriented melt, and allows for crystallization while keeping the state. As a result, nucleation (called homogeneous nucleation) and growth occur without the help of a foreign substance, by having the molecular chains contained in the oriented melt meet each other. This consequently allows for generation of NOC, and thus the polyester sheet in accordance with an aspect of the present invention can be produced.

The following description will further discuss the method for producing the polyester sheet in accordance with an aspect of the present invention with use of the rolling elongation crystallization device 10 illustrated in FIG. 10. In FIG. 10, focus is given on a region (hereinafter, referred to as "region AB") from a start of rolling elongation (A) to an end of the rolling elongation (B) by use of the sandwiching rollers 3. R is a radius of the sandwiching rollers 3 in the rolling elongation crystallization device 10, $\omega$ is an angular velocity of the sandwiching rollers 3, $\theta$ is an angle at which the sandwiching rollers 3 rotate, $L_0$ is a thickness of the supercooled melt at any location in the region AB, L is a thickness of the polyester sheet at point B, which is a point following the end of the rolling elongation, V is a sheet take-off speed by the sandwiching rollers, and $\varepsilon$ is the elongation strain rate. The roller rotation angle $\theta$ in the region AB is very small.

$$\theta \ll 1 \text{(rad)} \quad (1)$$

The radius R of the rollers is extremely larger than the sheet thicknesses $L_0$ and L.

$$R \gg L_{0,L} \quad (2)$$

A minute volume $\Phi$ at any location in the region AB is considered by taking a center of the minute volume as an origin. A direction (MD) in which the supercooled melt and the polyester sheet travel is considered as an x-axis, a width direction (TD) of the supercooled melt sheet is considered as a y-axis, and a thickness direction of the supercooled melt sheet is considered as a z-axis. The minute volume $\Phi$ is approximated by a rectangular parallelepiped, and the lengths of sides of the rectangular parallelepiped are considered as x, y, and $L_0$, respectively.

In sheet formation, it can be considered that the width of the supercooled melt sheet, i.e. y, is sufficiently longer than x and $L_0$, and does not change in length by the rolling elongation.

$$y = \text{const} \gg x, L_0 \quad (3)$$

Therefore, in the rolling elongation process with use of the sandwiching rollers, the supercooled melt sheet is compressed in the z-axis direction, and is elongated in the x-axis direction. Namely, the rolling elongation with use of the sandwiching rollers is related to only the x-axis and the z-axis.

Here, in a case where an elongation strain rate tensor in the x-axis direction is $\varepsilon_{xx}$ and an elongation strain rate tensor in the z-axis direction is $\varepsilon_{zz}$, a relationship between these is defined as follows:

$$\varepsilon_{xx} = -\varepsilon_{zz} \quad (5)$$

In derivation of the formula (5), the following law of conservation of mass related to minute volume $\Phi$ in rolling elongation is used:

$$\Phi \approx xyL_0 = \text{const} \quad (4)$$

The strain rate $\varepsilon_{zz}$ in the z-axis direction of the region AB in FIG. 1 is defined by the following definitional equation:

$$\varepsilon_{zz} \equiv (1/L_0) \times (dL_0/dt) \quad (6)$$

Note that t represents time.
Here, $$L_0 = 2R(1 - \cos\theta) + L \quad (7)$$

and accordingly the following formula (8) is approximately obtained based on the formulae (6), (7), and (1):

$$\varepsilon_{zz} \approx -2\omega\sqrt{\{(R/L_0) \times (1 - L/L_0)\}} \quad (8)$$

The elongation strain rate to be calculated is obtained from the formulae (5) and (8):

$$\varepsilon_{xx} \approx 2\omega\sqrt{\{(R/L_0) \times (1 - L/L_0)\}} \quad (9)$$

The $\varepsilon_{xx}$ is a function of $L_0$ from the formula (9).
The $\varepsilon_{xx}$ has a maximum value when:

$$L_0 = 2L \quad (10)$$

This means that the $\varepsilon_{xx}$ reaches its maximum value at $L_0 = 2L$, and that a maximum elongation strain rate is applied on the supercooled melt.

Having the maximum value of the elongation strain rate be represented as $\varepsilon_{max}$, substitution of the formula (10) into the formula (9) obtains the following formula:

$$\varepsilon_{max} \approx \omega\sqrt{(R/L)} \quad (11)$$

In order to form the sheet at a supercritical elongation strain rate, a condition that $\varepsilon_{max}$ is equal to or more than the critical elongation strain rate $\varepsilon^*$ is required.

Therefore, the formula (11) is defined as the elongation strain rate $\varepsilon$, thereby achieving the following formula:

[Math. 1]

$$\varepsilon(R, L, \omega) = \omega\sqrt{\frac{R}{L}} \quad (12)$$

$$V = R\omega \quad (13)$$

$$\omega(R, V) = V/R \quad (14)$$

From the formulae (12) and (14),

[Math. 2]

$$\varepsilon(R, L, V) = \frac{V}{R}\sqrt{\frac{R}{L}} = \frac{V}{\sqrt{RL}} \quad (15)$$

Hence, an intended polyester sheet in accordance with an aspect of the present invention is produced by setting the radius R of the sandwiching rollers, the average thickness L of the elongated polymer sheet, and the sheet take-off speed V of the sandwiching rollers so that the elongation strain rate $\varepsilon(R, L, V)$ becomes not less than the critical elongation strain rate, with use of the formula (15).

The critical elongation strain rate $\varepsilon^*(R, L, V)$ can be any rate determined by any method. For example, the rate can be calculated by the following approximate expression (Formula i):

(Formula i)

$$\varepsilon^*(R, L, V) = \frac{V^*}{\sqrt{RL}} \quad [\text{Math. 3}]$$

Here, V* denotes a sheet take-off speed V at a critical point, at which NOC is generated upon crystallization of the polymer melt to a polyester sheet having the thickness L by feeding the polyester melt in the supercooled state so as to be sandwiched between the pair of sandwiching rollers having the radius of R, and elongating the polyester melt by rolling at the sheet take-off speed V.

In the method of producing the polyester sheet in accordance with an aspect of the present invention, the critical elongation strain rate ε*(R, L, V) can be calculated by use of the following approximate expression (Formula ii):

(Formula ii)

$$\varepsilon^*(R, L, V) = \frac{V}{\sqrt{RL^*}}$$ [Math. 4]

Here, L* is a thickness L of the polyester sheet at a critical point, at which NOC is generated upon crystallization of the polyester melt to a polyester sheet having the thickness L by feeding the polyester melt in the supercooled state so as to be sandwiched between the pair of sandwiching rollers having the radius of R, and elongating the polyester melt by rolling at the sheet take-off speed V.

A method for determining whether or not NOC has been generated is not particularly limited, and it is possible to make the determination by, for example, an X-ray diffraction method which will be described later in Example.

In a case where the polyester melt of PET or the like has a high fluidity, there may be a case where it is difficult to elongate the polyester melt with use of the sandwiching rollers for the rolling elongation and crystallization, and the elongation cannot be carried out at a critical elongation strain rate or higher (refer to "(1) Preparation of sample in accordance with Example" below). Therefore, in a case where the polyester sheet in accordance with an aspect of the present invention is produced, it is preferable to adjust the fluidity (melt flow rate: MFR) such that the elongation can be carried out at the critical elongation strain rate or higher. That is, the method for producing the polyester sheet in accordance with an aspect of the present invention preferably includes the step of adjusting a fluidity of the polyester melt.

In the method for producing the polyester sheet in accordance with an aspect of the present invention, it is only necessary to adjust the fluidity of the polyester melt such that elongation can be carried out at the critical elongation strain rate or higher. For example, MFR of the polyester melt at 280° C. is preferably 80 (g/10 min) or less, further preferably 60 (g/10 min) or less, furthermore preferably 40 (g/10 min) or less, most preferably 20 (g/10 min) or less. Note that a lower limit of the MFR of the polyester melt at 280° C. is not particularly limited, provided that the elongation can be carried out at the critical elongation strain rate or higher, and is normally preferably 3 g/10 min or more.

The following description will discuss Example, to further specifically explain the embodiment of the present invention. It should be noted that the present invention is not limited to the Example, and details thereof can take various aspects. The present invention is not limited to the description of the embodiment above, but may be altered within the scope of the claims. An embodiment derived from a proper combination of technical means disclosed in different embodiments is also encompassed in the technical scope of the present invention.

EXAMPLE (1) Preparation of Sample in Accordance with Example

In this Example, PET and PEN indicated in Table 1 were used as materials of samples.

TABLE 1

| Material | $M_n$ | $M_w$ | $M_w/M_n$ | MFR [280° C.] |
|---|---|---|---|---|
| PET1 | 36,000 | 79,700 | 2.22 | 16 |
| PET2 | 21,000 | 53,600 | 2.55 | 46 |
| PET3 | 16,700 | 41,600 | 2.49 | 148 |
| PEN  | 6,200  | 26,500 | 4.25 | 13 |

In Table 1, "$M_n$" represents a number-average molecular weight, "$M_w$" represents a weight-average molecular weight, and "$M_w/M_n$" represents a coefficient of dispersion. $M_n$, $M_w$, $M_w/M_n$, of the polyester were measured with use of HLC-8320GPC manufactured by Tosoh Corporation. As a column, TSK-gel GMHHR-M×2 was used at 40° C. As a solvent of polyester, a mixed solvent was used in which chloroform and hexafluoroisopropyl alcohol (HFIP) were mixed at a ratio of 1:1. Note that a molecular weight obtained by measurement was a molecular weight in terms of polystyrene.

Moreover, "MFR [280° C.]" in Table 1 represents a melt flow rate (MFR) at 280° C. The MFR is obtained by heating and pressing a certain amount of synthetic resin at a predetermined temperature (280° C.) in a cylindrical container heated by a heater and measuring an amount of resin extruded from an opening (nozzle) provided at a bottom part of the container per 10 minutes. A unit of MFR is g/10 min. As a testing machine, an extruding type plastometer prescribed in JIS K6760 was used, and a measuring method is defined in JIS K7210.

With use of the rolling elongation crystallization device schematically illustrated in FIG. 10, PET samples indicated in Table 1 were elongated and crystallized. Conditions in the elongation and crystallization are indicated in Table 2. Note that Table 2 indicates results of the elongation and crystallization of PET1, PET2, and PEN. This is because, as the MFR increased (that is, fluidities of melts became higher in an order of PET1<PET2<PET3 (i.e., viscosities became lower)), the condition for rolling the melts with the rollers was restricted. Therefore, it is preferable to set fluidities of the PET melt and the PEN melt to be low to a certain extent (e.g., MFR [280° C.] is set to 80 (g/10 min) or less) in the rolling elongation with rollers and crystallization.

TABLE 2

| | Extrude | Roller | | |
|---|---|---|---|---|
| Sample | Maximum temperature $(T_{max})$/° C. | Temperature of melt $(T_{melt})$/° C. | Elongation strain rate $(\varepsilon)/s^{-1}$ | Thickness of sample/mm |
| 1 | 310 | 238 | 3.4 × 10² | 0.45 |
| 2 | 310 | 238 | 3.5 × 10² | 0.42 |
| 3 | 310 | 238 | 2.8 × 10² | 0.41 |
| 4 | 310 | 238 | 3.0 × 10² | 0.34 |
| 5 | 320 | 238 | 2.8 × 10² | 0.39 |
| 6 | 320 | 238 | 2.5 × 10² | 0.35 |
| 7 | 320 | 241 | 2.7 × 10² | 0.31 |
| 8 | 310 | 238 | 2.0 × 10² | 0.34 |
| 9 | 310 | 238 | 3.7 × 10² | 0.37 |
| 10 | 330 | 253 | 5.5 × 10² | 0.17 |
| 11 | 320 | 241 | 2.6 × 10² | 0.67 |
| 12 | 320 | 241 | 3.3 × 10² | 0.70 |
| 13 | 320 | 245 | 2.9 × 10² | 0.67 |
| 14 | 320 | 241 | 3.2 × 10² | 0.63 |
| 15 | 330 | 250 | 1.9 × 10² | 0.63 |

In Table 2, "Maximum temperature $(T_{max})$/° C." represents a temperature set in the extruder when PET (or PEN) is melted by the heater in the extruder so as to prepare a PET melt (or PEN melt). "Temperature of melt $(T_{melt})$/° C." in Table 2 represents a temperature of surfaces of the rollers (≈temperature of PET melt (or PEN melt)) when the PET melt (or PEN melt) is elongated by rolling with the rollers. "Elongation strain rate $(\varepsilon)/s^{-1}$" in Table 2 represents an elongation strain rate when the PET melt (or PEN melt) is elongated by rolling with the rollers. "Thickness of sample/mm" in Table 2 represents a thickness of a sample obtained by the elongation and crystallization.

In Table 2, samples 1 through 8 and 11 through 14 are samples prepared by use of PET1, a sample 9 is a sample prepared by use of PET2, and samples 10 and 15 are samples prepared by use of PEN.

Note that, as a result of studying in advance an elongation strain rate (critical elongation strain rate $\varepsilon^*$) at a critical point of obtaining NOC of PET, the critical elongation strain rate was found to be $1.5 \times 10^2 s^{-1}$. Moreover, a critical elongation strain rate of PEN was $3 \times 10^2 s^{-1}$.

(2) Preparation of Sample in Accordance with Comparative Example

In Comparative Example 1, a PET sheet was prepared from PET1 in Table 1 with use of an extruder (PLABOR manufactured by PLABOR Research Laboratory of Plastics Technology Co., Ltd.). Conditions for extrusion molding were as follows: resin was melted at a set temperature of 280° C. and was extruded from a die so as to be shaped into a sheet, and then the sheet was placed on a cast roll at a temperature of 20° C. by an electrostatic application method so as to be solidified.

The PET sheet obtained above was stretched with use of a stretching machine (compact stretching machine manufactured by ICHIKIN Co., Ltd.), and thus a uniaxially-stretched PET sheet was prepared. In the stretching, the PET sheet was stretched in the MD at an ambient temperature of 95° C. with a stretch magnification of 5 times.

The uniaxially-stretched PET sheet obtained above was fixed to a metal frame at 200° C. for one (1) minute, and a sample (thickness: 0.075 mm) in accordance with Comparative Example 1 was thus prepared (this sample is hereinafter referred to as "sample in accordance with Comparative Example of PET").

Meanwhile, in Comparative Example 2, a PEN sheet was prepared from PEN in Table 1 with use of an extruder (Labo Plasto Mill manufactured by TOYO SEIKI SEISAKU-SHO, LTD.). Conditions for extrusion molding were as follows: resin was melted at a set temperature of 300° C. and was extruded from a die so as to be shaped into a sheet, and then the sheet was placed on a cast roll at a temperature of 80° C. so as to be solidified.

The PEN sheet obtained above was stretched with use of a stretching machine (batch stretching machine manufactured by TOYO SEIKI), and thus a uniaxially-stretched PEN sheet was prepared. In the stretching, the PEN sheet was stretched in the MD at an ambient temperature of 150° C. with a stretch magnification of 5 times.

The uniaxially-stretched PEN sheet obtained above was fixed to a metal frame at 200° C. for one (1) minute, and a sample (thickness: 0.055 mm) in accordance with Comparative Example 2 was prepared (this sample is hereinafter referred to as "sample in accordance with Comparative Example of PEN").

(3) Observation with Polarization Microscope

The samples obtained above were observed with use of a polarization microscope. The polarization microscope used was BX51N-33P-OC manufactured by Olympus Corporation and observation was carried out in crossed nicols. In order to quantitatively measure change in retardation, a sensitive color test plate was inserted between a polarizer and an analyzer (polarizing plate) of the polarization microscope (Reference Document: Koubunnshisozai no henkoukenbikyou nyuumon (Introduction to polarization microscope for polymer material), Yu Awaya, AGNE Gijutsu Center Inc., 2001, p. 75-103). The observation with the polarization microscope was carried out at a room temperature of 25° C. The observation was carried out with respect to each of the samples in a sheet thickness direction (ND, through direction).

FIG. 1 shows results of the observation with the polarization microscope. Each of (a) and (b) of FIG. 1 is a polarization microscope image of the sample 2 in Table 2, as a representative case of Example of PET. Each of (c) and (d) of FIG. 1 is a polarization microscope image of the sample 10 in Table 2, as a representative case of Example of PEN. Each of (e) and (f) of FIG. 1 is a polarization microscope image of the sample in accordance with Comparative Example of PET. Note that each of (a), (c), and (e) of FIG. 1 is a polarization microscope image in a case where the sample was placed such that the MD becomes parallel with respect to the sensitive color test plate, and each of (b), (d), and (f) of FIG. 1 is a polarization microscope image in a case of an extinction angle.

By rotating the sample in a state in which the sensitive color test plate was being inserted, a color (that is, retardation) in the elongation direction (MD) changed from red-purple to yellow ((a), (c), and (e) of FIG. 1) and then to red-purple, and thus showed a distinct extinction angle (red-purple color) ((b), (d), and (f) of FIG. 1). From the change in retardation, the samples (samples 2 and 10 in Table 2) in accordance with Example and also the sample in accordance with Comparative Example were found to have polymer chains which are oriented in the elongation direction (MD).

(4) X-ray Diffraction (Small-angle X-ray Scattering Method)

The samples were observed by the SAXS method. The SAXS method was carried out in conformity to "*Koubunnshi Ekkusu-sen kaisetsu* (Polymer X-ray diffraction); Masao Kakudo, Nobutami Kasai, MARUZEN PUBLISHING CO., LTD., 1968" and "*Koubunnshi Ekkusu-sen kaisetsu* (Polymer X-ray diffraction), 3.3 edition, Toru Masuko, Yamagata University Co-op, 1995". More specifically, the SAXS method was carried out with beam line BL03XU or BL40B2 at Japan Synchrotron Radiation Research Institute (JASRI), SPring-8 under the following conditions: a wavelength λ of an X-ray=0.1 nm to 0.15 nm; a camera length=1.5 m to 3 m; a detector=imaging plate; and a room temperature=25° C. The observation was carried out in three directions, i.e., a direction (through) perpendicular to the MD and the TD, a direction (edge) parallel to the TD, and a direction (end) parallel to the MD. For the observation of the samples in the through direction and the edge direction, the MD was set to be the Z-axis direction. For the observation of the samples in the end direction, the TD was set to be the Z-axis direction. A time period during which the samples were exposed to the X-ray was 5 seconds to 180 seconds. Each of the imaging plates was scanned with use of a scanning device and reading software (raxwish, control) manufactured by Rigaku Corporation, and thus a two-dimensional image was obtained.

Figure 2:
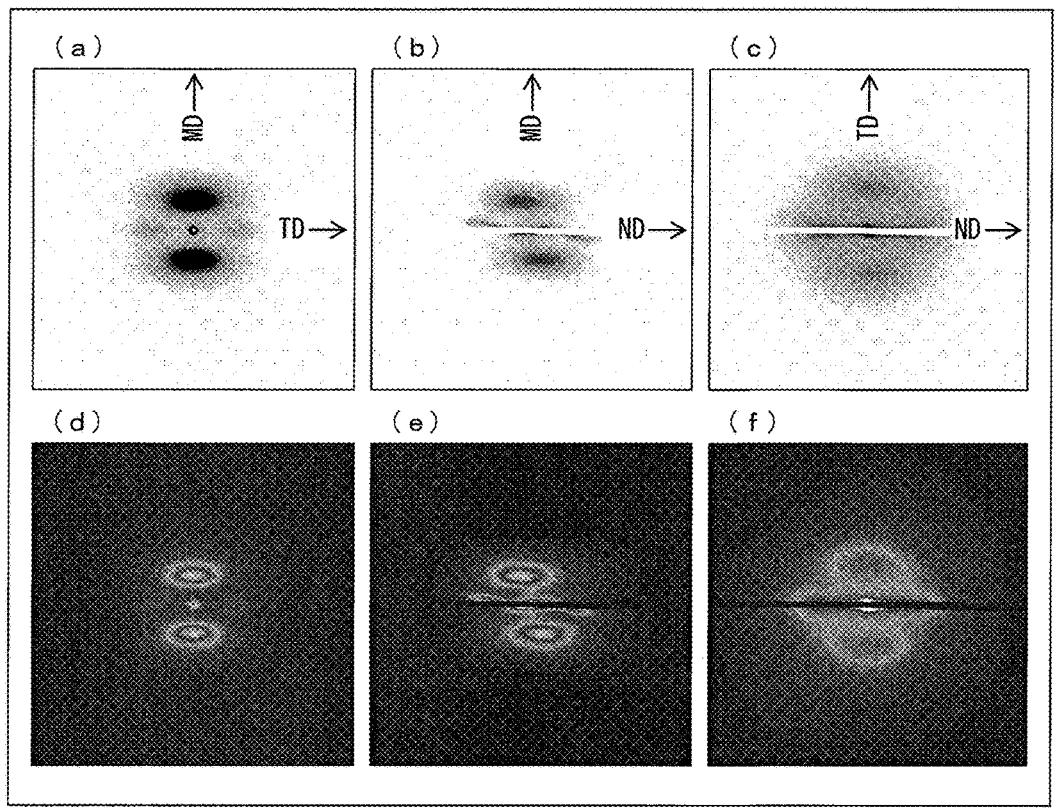
FIG. 2 is a small-angle X-ray scattering image of a sample in accordance with Example, and (a) and (d) of FIG. 2 show results observed from a through direction, (b) and (e) of FIG. 2 show results observed from an edge direction, and (c) and (f) of FIG. 2 show results observed from an end direction. Moreover, each of (a), (b), and (c) of FIG. 2 is a black and white image, and each of (d), (e), and (f) of FIG. 2 is a color image.

FIG. 2 shows SAXS images of the sample 7 in Table 2, as a representative case of the samples in accordance with Example of PET. (a) and (d) of FIG. 2 are results observed from the through direction, (b) and (e) of FIG. 2 are results observed from the edge direction, and (c) and (f) of FIG. 2 are results observed from the end direction. Each of (a), (b), and (c) of FIG. 2 is a black and white image, and each of (d), (e), and (f) of FIG. 2 is a color image.

In each of (a), (b), (d), and (e) of FIG. 2, a sharp two-point image in the MD was seen. This proves that the NC in the sample in accordance with Example of PET are oriented in the MD.

In each of (a), (c), (d), and (f) of FIG. 2, a vague two-point image in the TD was seen. This indicates that the NC contained in the sample in accordance with Example of PET are oriented with a weak correlation also in the TD. This is an aspect unique to PET.

Further, in each of (b), (c), (e), and (f) of FIG. 2, a vague two-point image was seen also in the ND. This indicates that the NC contained in the sample in accordance with Example of PET are oriented with a weak correlation also in the ND. This is an aspect unique to PET.

Figure 11:
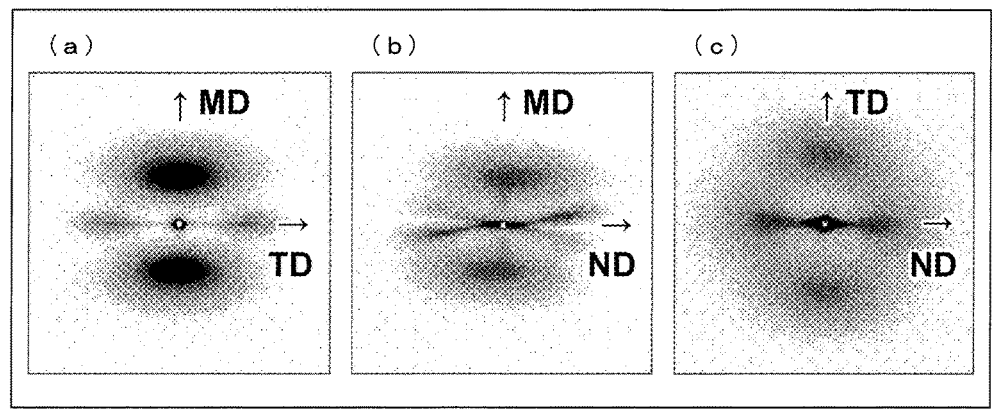
FIG. 11 is a SAXS image of a sample in accordance with Example, and (a) of FIG. 11 shows a result observed from a through direction, (b) of FIG. 11 shows a result observed from an edge direction, and (c) of FIG. 11 shows a result observed from an end direction.

FIG. 11 shows SAXS images of the sample 14 in Table as another case of the samples in accordance with Example of PET. (a) of FIG. 11 shows a result observed from the through direction, (b) of FIG. 11 shows a result observed from the edge direction, and (c) of FIG. 11 shows a result observed from the end direction.

As in (a) of FIG. 11, a sharp two-point image was seen in the MD, and a vague two-point image was seen in the TD. The two-point images in respective of the MD and the TD were perpendicular to each other.

Figure 15:
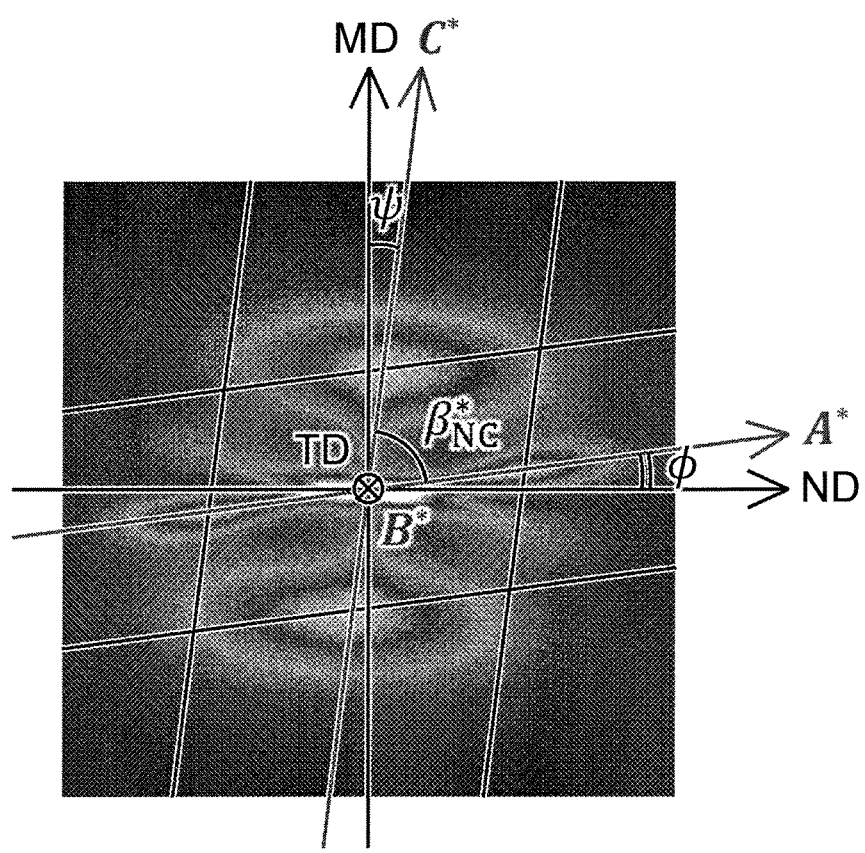
FIG. 15 shows a structural analysis example indicated as a color image of (b) of FIG. 11. A*, B*, and C* (indicated in boldface in the drawing; the same applies to the entire specification) are reciprocal vectors of NOC, and $\beta^*_{NC}$ is an angle formed between A* and C*. A unique axis is B*//TD. $\psi$ is an angle formed between C* and MD, and $\phi$ is an angle formed between A* and ND, where a clockwise direction is positive.

FIG. 15 shows a result of analysis carried out on (b) of FIG. 11 with use of two-dimensional image analysis software (Display Win manufactured by Rigaku Corporation). As in (b) of FIG. 11 and FIG. 15, a two-point image was seen at a location tilted from the MD by $\psi$, and another two-point image was also seen at a location tilted from the ND by $-\phi$. Those two-point images had a relation of an angle $\beta^*_{NC}$.

Further, as in (c) of FIG. 11, a two-point image was seen in the TD, and another two-point image was seen in the ND. The two-point images in respective of the TD and ND were perpendicular to each other.

The two-point images were seen in all of (a), (b), and (c) of FIG. 11, and this indicated that the NC of PET were arranged in a three dimensional (3D) lattice pattern. Note, however, that a two-point image of SAXS is a primary peak of diffraction by a "paracrystal lattice" (Reference Document: A. Guinier, A Theory of Technique of the Radiocrystallography, Tokyo: Rigaku Denki, 1967, Chap. 10 & 11) which is random in periodicity. Therefore, to be accurate, the NC of PET were arranged in a "3D paracrystal lattice" manner.

As such, it was found that the crystal form of the NOC was monoclinic, and the unique axis (Reference Document: International tables for crystallography, Vol. A, (ed. T. Hahn) Netherlands: Kluwer Academic Publishers, 1996, pp. 106-107) was B*//TD.

Note that, although data is not indicated, results of the other samples in accordance with Example (i.e., the samples 1 through 6, 8, 9, 11, 12, and 13 in Table 2) were similar to those in FIG. 2 or FIG. 11.

Figure 3:
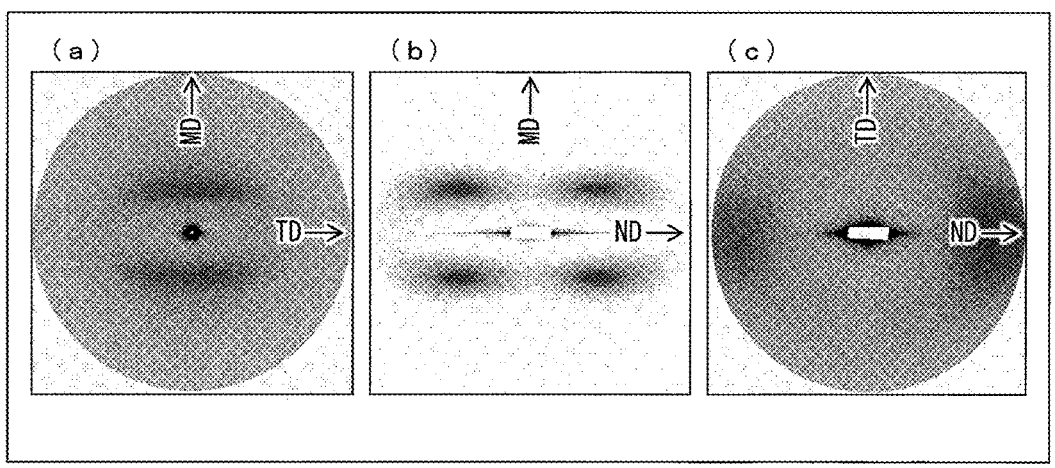
FIG. 3 is a small-angle X-ray scattering image of a sample in accordance with Comparative Example, and (a) of FIG. 3 shows a result observed from a through direction, (b) of FIG. 3 shows a result observed from an edge direction, and (c) of FIG. 3 shows a result observed from an end direction.

Meanwhile, FIG. 3 shows SAXS images of the sample in accordance with Comparative Example of PET. (a) of FIG. 3 shows a result observed from the through direction, (b) of FIG. 3 shows a result observed from the edge direction, and (c) of FIG. 3 shows a result observed from the end direction.

In each of (a) and (b) of FIG. 3, a 4-point image was seen in the MD. This indicates that a crystal structure of the sample in accordance with Comparative Example of PET is a "laminated lamellar structure" in which a folded chain crystals (FCC) and amorphous materials are laminated (Reference Document: Non-Patent Literature 1).

Moreover, from FIG. 3, it can be seen that a direction in which lamellae were laminated in the sample in accordance with Comparative Example of PET was tilted with respect to the MD and such a structure has many defects as a crystal form.

(5) X-ray Diffraction (Wide-angle X-ray Scattering Method)

The samples were observed by the WAXS method. The WAXS method was carried out with beam line BL03XU or BL40B2 at Japan Synchrotron Radiation Research Institute (JASRI), SPring-8 under the following conditions: a wavelength $\lambda$ of an X-ray=0.1 nm to 0.15 nm; a camera length R=260 mm to 310 mm; a detector=imaging plate; and a room temperature=25° C. For the observation of the samples in the through direction and the edge direction, the MD was set to be the Z-axis direction. For the observation of the sample in the end direction, the TD was set to be the Z-axis direction. A time period during which the samples were exposed to the X-ray was 10 seconds to 180 seconds. Each of the imaging plates was scanned with use of a scanning device and reading software (raxwish, control) manufactured by Rigaku Corporation, and thus a two-dimensional image was obtained.

Figure 4:
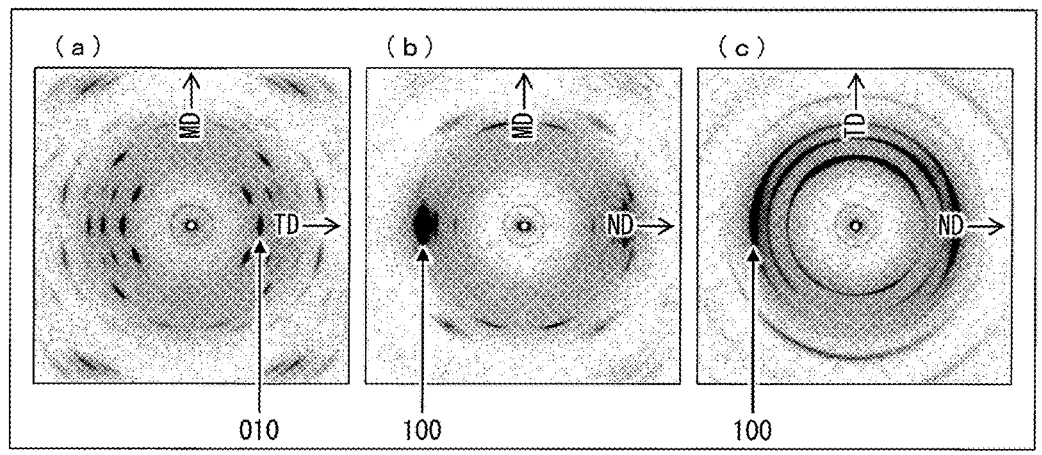
FIG. 4 is a wide-angle X-ray scattering image of a sample in accordance with Example, and (a) of FIG. 4 shows a result observed from a through direction, (b) of FIG. 4 shows a result observed from an edge direction, and (c) of FIG. 4 shows a result observed from an end direction.

FIG. 4 shows WAXS images of the sample 7 in Table 2 as a representative case of the samples in accordance with Example of PET. (a) of FIG. 4 shows a result observed from the through direction, (b) of FIG. 4 shows a result observed from the edge direction, (c) of FIG. 4 shows a result observed from the end direction.

As shown in (a) and (b) of FIG. 4, the polymer chain (c-axis of crystal) of the sample in accordance with Example of PET was highly oriented in the MD. On the other hand, from a fact that (c) of FIG. 4 shows a Debye-Scherrer ring with almost no orientation, it can be seen that the a-axis and b-axis of the crystals of the sample in accordance with Example of PET were substantially not oriented. From this, it was found that the sample in accordance with Example of PET was NOC.

As in each of (a) and (b) of FIG. 4, extremely sharp reflection was seen. This indicates that the crystal structure of the sample in accordance with Example of PET is highly-ordered. This is characteristic in the NOC of PET.

Moreover, reflection 100 in (b) of FIG. 4 is extremely strong. Moreover, also in (c) of FIG. 4, reflection 100 is a bit strong. These indicate that an a-axis of the crystals contained in the sample in accordance with Example of PET is in plane orientation in the ND.

Further, from the results of FIG. 4, the crystal structure of PET was confirmed to be a triclinic system (Reference Document 1: R. de P. Daubeny and C. W. Bunn Proc. R. Soc. Lond. A 226, 531 (1954).)

Figure 12:
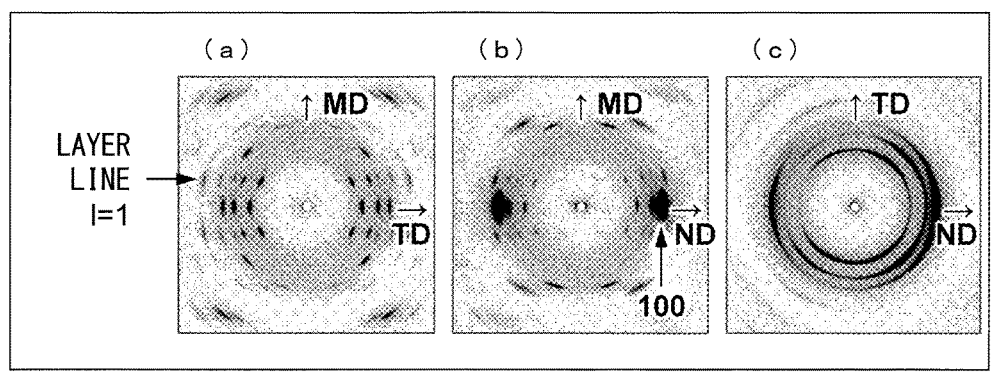
FIG. 12 is a WAXS image of a sample in accordance with Example, and (a) of FIG. 12 shows a result observed from a through direction, (b) of FIG. 12 shows a result observed from an edge direction, and (c) of FIG. 12 shows a result observed from an end direction.

FIG. 12 shows WAXS images of the sample 14 in Table as another case of the samples in accordance with Example of PET. (a) of FIG. 12 shows a result observed from the through direction, (b) of FIG. 12 shows a result observed from the edge direction, and (c) of FIG. 12 shows a result observed from the end direction.

From (a) and (b) of FIG. 12, it was found that a crystal structure of a unit cell was triclinic and a polymer chain was highly oriented in the MD.

Moreover, (c) of FIG. 12 shows an arc-shaped pattern instead of the Debye-Scherrer ring pattern, and this showed biaxial orientation.

In (a) of FIG. 12, reflection went beyond a layer line upward and downward, and this was found to be a "highly-ordered structure in which a polymer chain is tilted from the MD by 5°" which is characteristically seen only in annealing which is carried out at a sufficiently high temperature (Reference Document 1 and Reference Document: T. Asano, and T. Seto, Polymer J., 5, 72 (1973)).

Figure 5:
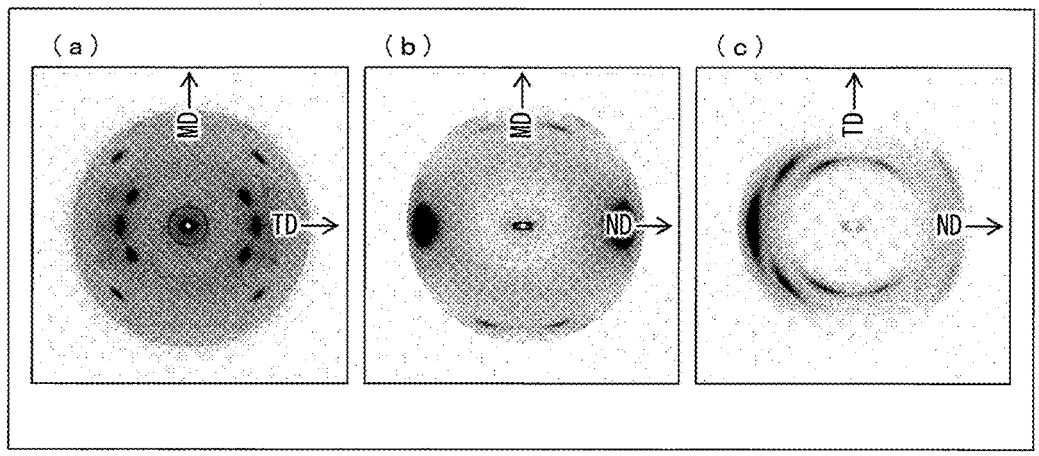
FIG. 5 is a wide-angle X-ray scattering image of a sample in accordance with Comparative Example, and (a) of FIG. 5 shows a result observed from a through direction, (b) of FIG. 5 shows a result observed from an edge direction, and (c) of FIG. 5 shows a result observed from an end direction.

Next, FIG. 5 shows WAXS images of the sample in accordance with Comparative Example of PET. (a) of FIG. 5 shows a result observed from the through direction, (b) of FIG. 5 shows a result observed from the edge direction, and (c) of FIG. 5 shows a result observed from the end direction.

As in (a) and (b) of FIG. 5, it was found that the polymer chain (c-axis of crystal) of the sample in accordance with Comparative Example of PET was highly oriented in the MD. Moreover, reflection 100 was strong in (b) and (c) of FIG. 5. This can be considered that an a-axis of the crystals in the sample in accordance with Comparative Example had plane orientation.

However, as in FIG. 5, reflection was broad and scattering intensity rapidly decreased as a scattering angle increased. Thus, the crystals of the sample in accordance with Comparative Example of PET were imperfect and low ordered.

Further, from the results of FIG. 5, it was confirmed that the crystal structure of PET was a triclinic system (Reference Document 1).

(6) Analysis of Orientation Function $f_c$ (a) of FIG. 4 and (a) of FIG. 5 were analyzed with spreadsheet software (Igor Pro manufactured by WaveMetrics), and thus an orientation function $f_c$ for the samples in accordance with Example of PET and the sample in accordance with Comparative Example of PET was obtained. With regard to reflection 010 in (a) of FIG. 4, a curve of the wide-angle X-ray scattering intensity ($I_x$) against the angle of deviation (β) was obtained by background correction. More specifically, $f_c$ was calculated by using $$f_c = (3 \langle \cos 2\beta \rangle - 1) \div 2 \qquad \text{Orientation function formula}$$

where $$\langle \cos^2 \beta \rangle = \frac{\int_0^{\pi/2} I_X(\beta) \sin\beta \cos^2\beta \, d\beta}{\int_0^{\pi/2} I_X(\beta) \sin\beta \, d\beta} \qquad \text{[Math. 5]}$$

As a result of the analysis, it was found that an orientation function $f_c$ of the sample (sample 7 in Table 2) in accordance with Example of PET was 0.97, and an orientation function $f_c$ of the sample in accordance with Comparative Example of PET was 0.96. As such, in both the samples, the orientation function $f_c \approx 1$, and it was therefore found that the polymer chains included in both the samples were highly oriented.

(7) Analysis of Density ρ

A density ρ of each of the sample in accordance with Example of PET and the sample in accordance with Comparative Example of PET was obtained. The density p was measured with use of a density gradient tube method specific gravity meter MODEL-A (manufactured by Shibayama Scientific Co., Ltd.).

Table 3 shows results.

TABLE 3

| | | Density (ρ)/g/cm³ |
|---|---|---|
| Example | Sample 1 | 1.4100 |
| | Sample 3 | 1.4030 |

TABLE 3-continued

| | | Density (ρ)/g/cm³ |
|---|---|---|
| | Sample 5 | 1.4061 |
| | Sample 8 | 1.4055 |
| | Sample 11 | 1.4043 |
| | Sample 12 | 1.4133 |
| | Sample 13 | 1.4105 |
| Comparative Example 1 | | 1.3858 |

As shown in Table 3, the density p of each of the samples in accordance with Example of PET was 1.4 g/cm³ or more. On the other hand, the density p of the sample in accordance with Comparative Example of PET was less than 1.4 g/cm³. As such, the samples in accordance with Example of PET were found to be higher in density than the sample in accordance with Comparative Example of PET.

A density $\rho_c$ of the crystals in PET was 1.455 g/cm³, a density $\rho_c$ of the amorphous materials in PET was 1.335 g/cm³ (Reference Document 2: M. Rule, Polymer Handbook 4th ed. (ed. Brandrup, J. et al.), V/113 (John Wiley & Sons, Inc., Hoboken, N.J., 1999)). From these, a ratio of the crystals in the sample in accordance with Example of PET is inferred to be higher than that in the sample in accordance with Comparative Example of PET, in view of the results in Table 3. As early described, the sample in accordance with Comparative Example of PET has the "laminated lamellar structure" in which folded chain crystals (FCC) and amorphous materials are laminated, and the presence of the amorphous materials seems to cause the decrease in density.

(8) Analysis of Crystal Size and Structure of NOC

From the two-point images in the MD, TD, and ND of FIG. 2, a crystal size (d) of each of the samples in accordance with Example of PET was obtained. A primary peak of a curve of the small-angle X-ray scattering intensity ($I_x$) against the scattering vector (q) in the SAXS method corresponds to a shortest distance between microcrystals (=crystal size d) in cases where microcrystals of an average size d are randomly packed (Reference Document: A. Guinier, "*Ekkusu-sen Kessyogaku no Riron to Jissai*" (Theory and Practice of X-ray Crystallography), Rigaku Corporation, p. 513, 1967), and therefore the crystal size d is calculated by the following Bragg equation:

$$d = 2\pi \div q \qquad \text{Bragg equation}$$

The crystal size (of NC) of the sample in accordance with Example of PET (sample 7 in Table 2) was found to be as follows: 21 nm in the MD, and 15 nm in each of the TD and ND. The crystal size (of NC) of the sample in accordance with Example of PET (sample 11 in Table 2) was found to be as follows: 21 nm in the MD, 15 nm in the TD, and 16 nm in the ND. The crystal size (of NC) of the sample in accordance with Example of PET (sample 12 in Table 2) was found to be as follows: 21 nm in the MD, and 14 nm in the TD. The crystal size (of NC) of the sample in accordance with Example of PET (sample 13 in Table 2) was found to be as follows: 21 nm in the MD, and 15 nm in the TD. The crystal size (of NC) of the sample in accordance with Example of PET (sample 14 in Table 2) was found to be as follows: 21 nm in the MD, 14 nm in the TD, and 17 nm in the ND.

As a result of observation with the microscope and observation with the X-ray, the samples in accordance with Example of PET seemed to have the structure as shown in FIG. 6. That is, the NOC contained in each of the samples in accordance with Example of PET have the structure in which spindle-shaped (or rugby-ball-shaped) NC are arranged in such a manner as to be tied in a row in the MD, and the polymer chain constituting the NC is highly oriented in the MD. Moreover, the NC are also oriented with a weak correlation in the TD and the ND. This is a characteristic structure of the NOC of PET.

Meanwhile, the crystal size (of NC) of the sample in accordance with Example of PEN (sample 10 in Table 2) was found to be as follows: 26 nm in the MD, and 18 nm in the TD. Moreover, the crystal size (of NC) of the sample in accordance with Example of PEN (sample 15 in Table 2) was found to be as follows: 23 nm in the MD, and 15 nm in the ND. Note that, as a result of observation with the microscope and observation with the X-ray, the samples of PEN seemed to have the structure as shown in FIG. 6, as with the samples of PET.

(9) Analysis of Heatproof Temperature heatproof temperatures of the samples in accordance with Example of PET (samples 7 and 14 in Table 2), the sample in accordance with Example of PEN (sample 10 in Table 2), the sample in accordance with Comparative Example of PET, and the sample in accordance with Comparative Example of PEN were measured by a test-piece size direct-reading method with use of an optical microscope. A test piece (length of 0.7 mm, width of 0.5 mm) was placed in a hot stage (L-600A manufactured by Linkam Scientific Instruments Ltd.) and a temperature in the hot stage was increased at a temperature increase rate of 1 K per minute. In this case, observation and recording were carried out with use of an optical microscope with a CCD camera (BX51N-33P-OC manufactured by Olympus Corporation). With use of image-analysis software (Image-Pro PLUS manufactured by Media Cybernetics, Ltd.), a length direction (MD) and a width direction (TD) of the test piece were quantitatively measured, and a temperature at which the test piece started to shrink (or expand) by 3% or more in the MD or the TD was considered as the heatproof temperature $T_h$. Moreover, melting points $T_m$ of the sample in accordance with Example of PET, the sample in accordance with Example of PEN, the sample in accordance with Comparative Example of PET, and the sample in accordance with Comparative Example of PEN were also analyzed.

Figure 7:
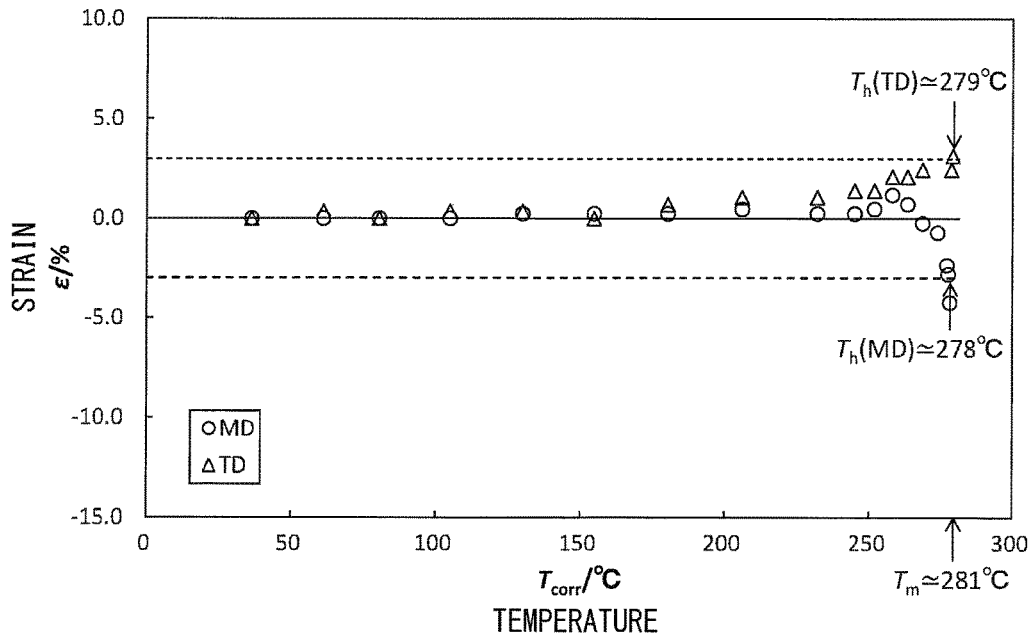
FIG. 7 is a plot illustrating a result of studying a heatproof temperature of a sample in accordance with Example of PET.
Figure 13:
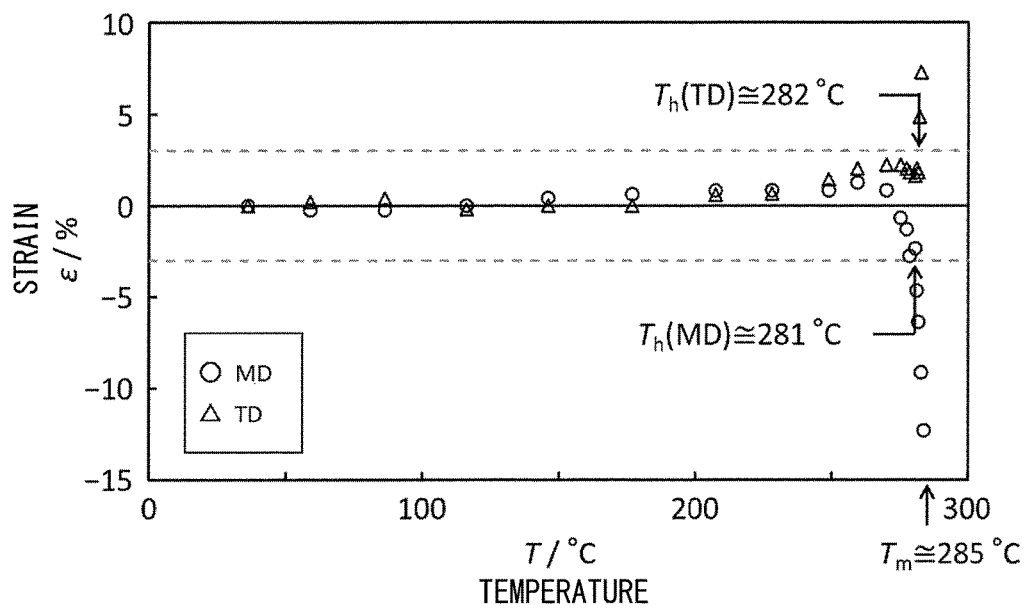
FIG. 13 is a plot illustrating a result of studying a heatproof temperature of a sample in accordance with Example of PET.
Figure 14:
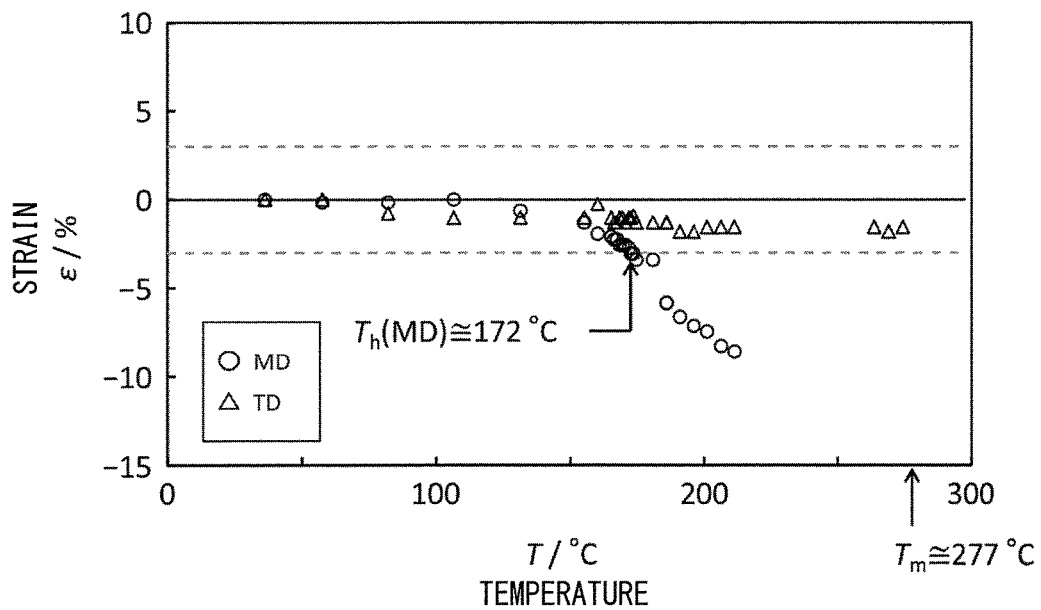
FIG. 14 is a plot illustrating a result of studying a heatproof temperature of a sample in accordance with Comparative Example of PEN.

The heatproof temperatures were analyzed as to the sample in accordance with Example of PET (FIG. 7 (sample 7 in Table 2) and FIG. 13 (sample 14 in Table 2)), the sample in accordance with Example of PEN (FIG. 8), the sample in accordance with Comparative Example of PET (FIG. 9), and the sample in accordance with Comparative Example of PEN (FIG. 14).

According to FIG. 7, it was found that a temperature ($T_h$ (MD)) of straining by 3% or more in the MD was approximately 278° C., and a temperature ($T_h$ (TD)) of straining by 3% or more in the TD was approximately 279° C. Therefore, the heatproof temperature $T_h$ of the sample in accordance with Example was determined to be approximately 278° C. Moreover, the melting point $T_m$ of the sample in accordance with Example of PET was approximately 281° C.

Figure 8:
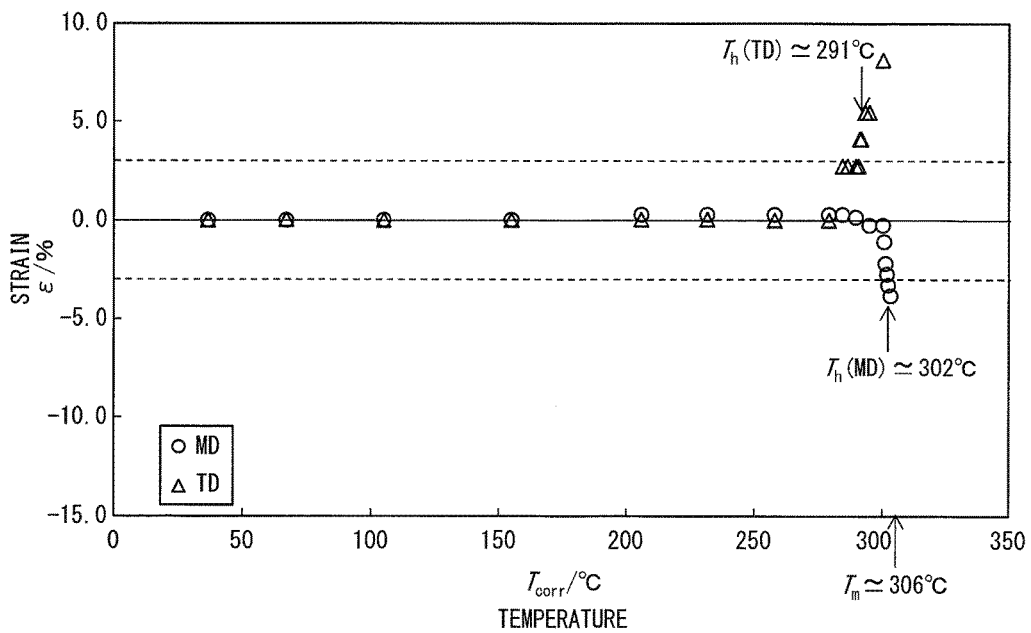
FIG. 8 is a plot illustrating a result of studying a heatproof temperature of a sample in accordance with Example of PEN.

Moreover, according to FIG. 8, it was found that a temperature ($T_h$ (MD)) of straining by 3% or more in the MD was approximately 302° C., and a temperature ($T_h$ (TD)) of straining by 3% or more in the TD was approximately 291° C. Therefore, the heatproof temperature $T_h$ of the sample in accordance with Example of PEN was determined to be approximately 291° C. Moreover, the melting point $T_m$ of the sample in accordance with Example of PEN was approximately 306° C.

Further, according to FIG. 13, it was found that a temperature ($T_h$ (MD)) of straining by 3% or more in the MD was approximately 281° C., and a temperature ($T_h$ (TD)) of straining by 3% or more in the TD was approximately 282° C. Therefore, the heatproof temperature $T_h$ of the sample in accordance with Example was determined to be approximately 281° C. Moreover, the melting point $T_m$ of the sample in accordance with Example of PET was approximately 285° C.

Figure 9:
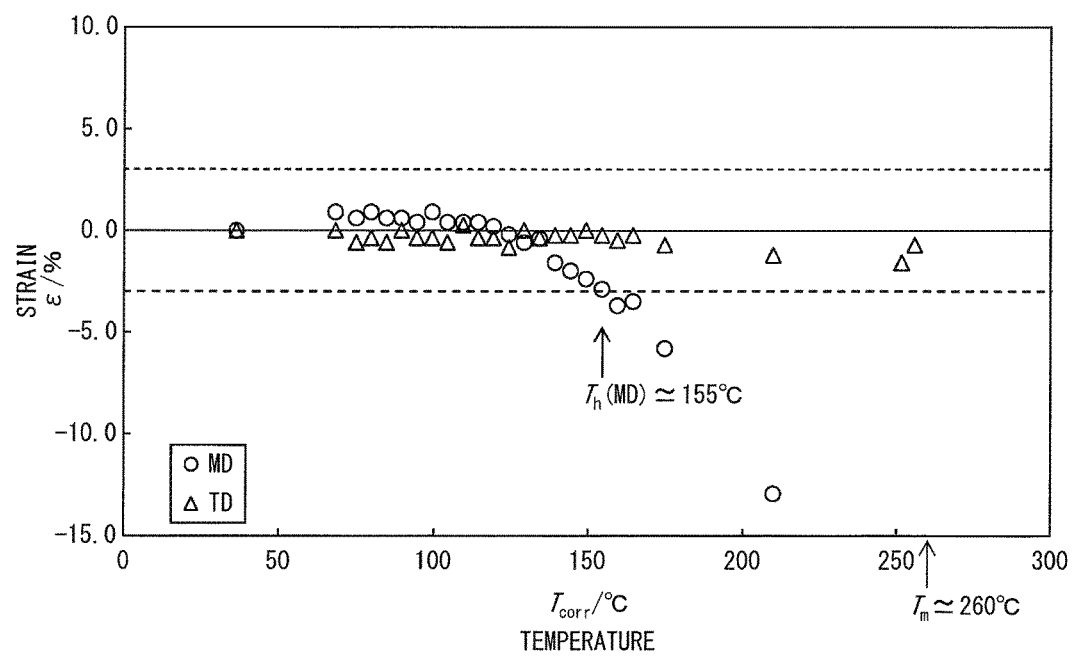
FIG. 9 is a plot illustrating a result of studying a heatproof temperature of a sample in accordance with Comparative Example of PET.

On the other hand, according to FIG. 9, it was found that a temperature ($T_h$ (MD)) of straining by 3% or more in the MD was approximately 155° C. Therefore, the heatproof temperature of the sample in accordance with Comparative Example of PET was determined to be approximately 155° C. Moreover, the melting point $T_m$ of the sample in accordance with Comparative Example of PET was approximately 260° C.

Moreover, according to FIG. 14, it was found that a temperature ($T_h$ (MD)) of straining by 3% or more in the MD was approximately 172° C. Therefore, the heatproof temperature of the sample in accordance with Comparative Example of PEN was determined to be approximately 172° C. Moreover, the melting point $T_m$ of the sample in accordance with Comparative Example of PEN was approximately 277° C.

Example of PET and Comparative Example of PET were compared and Example of PEN and Comparative Example of PEN were compared, and it was found that the samples of Example were greatly higher in heatproof temperature and melting point than the samples of Comparative Example. This is a notable effect brought about by the samples in accordance with Example of the present invention.

Moreover, a difference between the heatproof temperature and the melting point $T_m$ of the sample in accordance with Comparative Example of PET was 100 K or more, whereas a difference between the heatproof temperature and the melting point $T_m$ of each of the samples in accordance with Example of PET was approximately several K. As such, in the samples in accordance with Example of PET, it was found that the conventional problem that the heatproof temperature is lower than the melting point was greatly improved.

Meanwhile, with regard to PEN also, a difference between the heatproof temperature and the melting point $T_m$ of the sample in accordance with Comparative Example of PEN was 100 K or more, whereas a difference between the heatproof temperature and the melting point $T_m$ of each of the samples in accordance with Example of PEN was approximately 15 K. As such, in the samples in accordance with Example of PEN, it was found that the conventional problem that the heatproof temperature is lower than the melting point was greatly improved.

(10) 3D Form Model of NOC

With use of two-dimensional image analysis software (Display Win manufactured by Rigaku Corporation), (b) of FIG. 11 was analyzed (FIG. 15). In FIG. 15, A*, B*, and C* are reciprocal vectors of NOC, and $\beta^*_{NC}$ is an angle formed between A* and C*. Moreover, a unique axis is B*//TD. ψ is an angle formed between C* and MD, φ is an angle formed between A* and ND, where a clockwise direction is positive.

As a result of analysis, it was found that ψ was 7.2°, and φ was −7.5°.

Here, from the above "(8) Analysis of crystal size and structure of NOC", the crystal size of NC was 21 nm in the MD (=C), 14 nm in the TD (=B), and 17 nm in the ND (=A).

Figure 16:
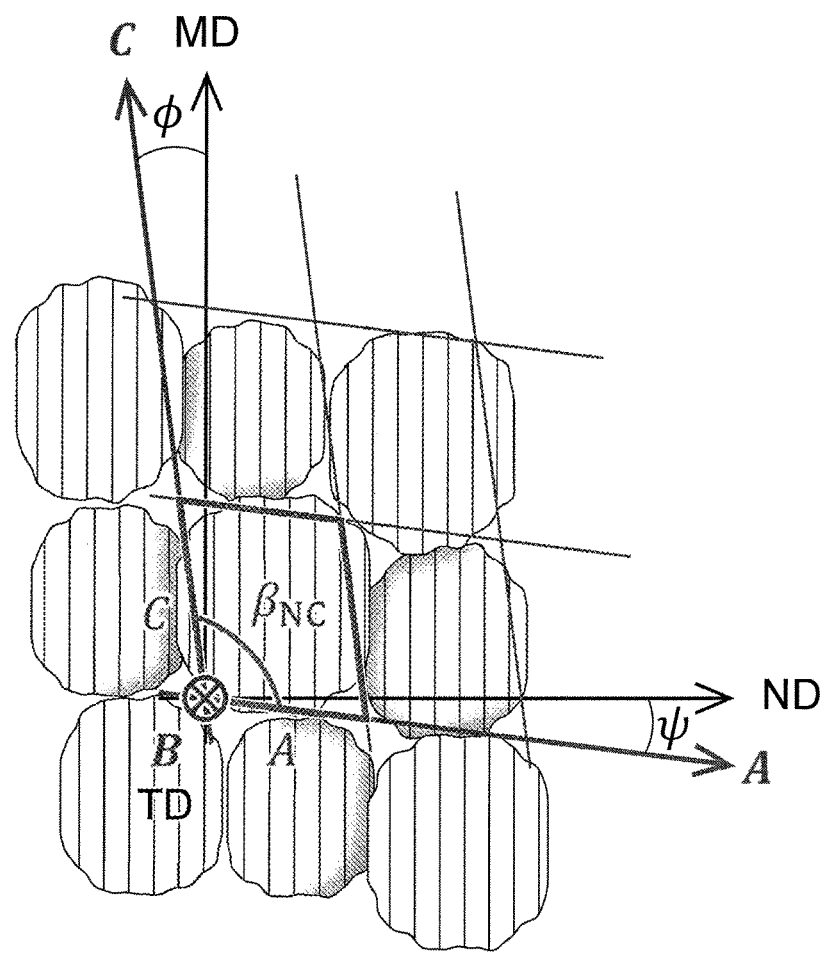
FIG. 16 is a schematic view showing a 3D form model of NOC and a size of NC. A, B, and C (indicated in boldface in the drawing; the same applies to the entire specification) are monoclinic lattice vectors of NOC corresponding to a NC size, $\beta_{NC}$ is an angle formed between A and C, and $\beta_{NC} \neq 90°$.

Further, from the above "(4) X-ray diffraction (small-angle X-ray scattering method)", the crystal form of NOC was monoclinic. As such, it was found that NC were arranged with a strong correlation in a direction tilted by $\phi$ from the MD and with a weak correlation in a direction tilted by $\psi$ from the ND as illustrated in the schematic view of FIG. 16.

Subsequently, an angle $\beta_{NC}$ formed by A and C was calculated. The calculation of $\beta_{NC}$ was carried out with use of the following formula:

$$\beta_{NC} \equiv \frac{\pi}{2} + \psi + |\phi| \qquad \text{[Math. 6]}$$

As a result of calculating $\beta_{NC}$ by the above formula, it was found that $\beta_{NC}$ of the sample in accordance with Example of PET (sample 14 in Table 2) was 104.7°, and a unique axis (Reference Document: International tables for Crystallography, Vol. A, (ed. T. Hahn) Netherlands: Kluwer Academic Publishers, 1996, pp. 106-107) was B//B*.

Moreover, with regard to the sample (sample 11 in Table 2) in accordance with another Example of PET and the sample (sample 15 in Table 2) in accordance with Example of PEN also, analysis was carried out with use of the two-dimensional image analysis software (Display Win manufactured by Rigaku Corporation), and $\psi$ and $\phi$ of each of the samples were determined.

As a result, an orientation of NOC in the sample (sample 11 in Table 2) in accordance with another Example of PET was as follows: $\psi=3.9°$, and $\phi=-10.1°$, and an orientation of NOC in the sample in accordance with Example of PEN (sample 15 in Table 2) was as follows: $\psi=6.1°$, and $\phi=-14.2°$.

Further, as a result of analysis, the crystal form of NOC in the sample (sample 15 in Table 2) in accordance with Example of PEN was found to be monoclinic.

(11) Molten Solder Bath Test

Test pieces were cut out from the respective samples, and gauge marks in the MD and the TD were given on a surface of a highly heat-resistant polyester sheet with a laser marker. Subsequently, the samples were soaked in a bath of molten solder at 260° C. so as to float for 30 seconds, and then taken out from the bath of molten solder. A deformation ratio (%) was calculated from the gauge marks given with the laser marker, based on the following formula:

$$\frac{L-L_0}{L_0} \times 100 \text{ for } MD, TD \qquad \text{[Math. 7]}$$

In the formula, L represents a length between the gauge marks after deformation, and $L_0$ represents a length between gauge marks before deformation.

As the samples, the sample in accordance with Example of PET (as representative cases, the samples 11, 12, and 13 in Table 2), the sample in accordance with Comparative Example of PET, and the sample in accordance with Comparative Example of PEN were used. Moreover, as Referential Example, Kapton (manufactured by DU PONT-TORAY CO., LTD., Kapton (polyimide film) grade: 500 H, thickness: 125 μm) was used which is generally used for the purpose of heat resistance.

A deformation ratio of the sample (sample 11 in Table 2) in accordance with Example of PET was 0.482% in the MD and −0.305% in the TD. A deformation ratio of the sample (sample 12 in Table 2) in accordance with Example of PET was 0.157% in the MD and −0.072% in the TD. A deformation ratio of the sample (sample 13 in Table 2) in accordance with Example of PET was 0.325% in the MD and −0.323% in the TD.

On the other hand, the sample in accordance with Comparative Example of PET and the sample in accordance with Comparative Example of PEN were considerably deformed, and thus deformation ratios of those samples were unmeasurable.

From those, it was proved that the sample in accordance with Example of PET had higher heat resistance, as compared with the sample in accordance with Comparative Example of PET.

Moreover, a deformation ratio of Kapton as Referential Example was −0.281% in the MD and −0.217% in the TD.

The deformation ratios of the sample in accordance with Example of PET and Kapton were compared with each other, and it was proved that the sample in accordance with Example of PET had a low deformation ratio (i.e., high heat resistance) which was similar to that of Kapton. Therefore, the sample in accordance with Example of the present invention (in particular, the sample in accordance with Example of PET) seemed to be usable for a purpose similar to that of Kapton, e.g., for a purpose of high heat resistance.

INDUSTRIAL APPLICABILITY

As above described, the polyester sheet in accordance with the present invention has higher heat resistance as compared with a conventional polyester sheet. Therefore, according to the present invention, it is possible to use a polyester sheet of PET or the like, which has been difficult to use as engineering plastic or super engineering plastic due to insufficient heat resistance, in industrial products and the like for which heat resistance is requested.

REFERENCE SIGNS LIST

1: Supercooled melt
2a: Extruder
2b: Cooling adapter
3: Sandwiching rollers
10: Rolling elongation crystallization device

The invention claimed is:

1. A polyester sheet consisting of polyester, wherein the polyester sheet contains crystals of polyester which is a polycondensate of polyvalent carboxylic acid and polyalcohol,
   the crystals being nano-oriented crystals including crystals of polyester in each of which a polymer molecular chain is oriented and each of which has a crystal size of 50 nm or less, wherein the polyester sheet contains the nano-oriented crystals as a main component,
   a heatproof temperature of said polyester sheet being higher than a temperature that is lower than an equilibrium melting point of the polyester by 80° C.

2. The polyester sheet as set forth in claim 1, wherein:
   said polyester sheet has a melting point higher than a temperature that is lower than the equilibrium melting point of the polyester by 40° C.

3. The polyester sheet as set forth in claim 1, wherein:
   the nano-oriented crystals have a structure in which spindle-shaped crystals are arranged in such a manner as to be tied in a row.

4. The polyester sheet as set forth in claim 1, wherein:
   the heatproof temperature of said polyester sheet is 200° C. or higher.

5. The polyester sheet as set forth in claim 1, wherein:
the polyester is polyethylene terephthalate or polyethylene naphthalene dicarboxylate.

6. The polyester sheet as set forth in claim 1, wherein:
the polyester is polyethylene terephthalate.

7. The polyester sheet as set forth in claim 6, wherein:
a density of said polyester sheet is 1.4 g/cm³ or more.

8. The polyester sheet as set forth in claim 1, wherein:
a crystal form of the nano-oriented crystals of the polyester is monoclinic.

9. The polyester sheet as set forth in claim 1, wherein:
said polyester sheet is used in high-temperature processing at a temperature higher than 200° C.

10. The polyester sheet as set forth in claim 9, wherein:
said polyester sheet is used as a base material of a laminated body including an electrically conductive transparent layer.

11. The polyester sheet as set forth in claim 9, wherein:
said polyester sheet is used as a base material of a flexible circuit board.

12. A flexible circuit board comprising a polyester sheet recited in claim 11 as a base material.

13. The polyester sheet as set forth in claim 1, wherein the polyester sheet contains the nano-oriented crystals in an amount of 60% or higher.

* * * * *